United States Patent [19]
Todome et al.

[11] Patent Number: 5,983,374
[45] Date of Patent: Nov. 9, 1999

[54] SEMICONDUCTOR TEST SYSTEM AND METHOD, AND MEDIUM FOR RECORDING TEST PROGRAM THEREFOR

[75] Inventors: Makoto Todome; Akira Mochizuki; Tamio Hiraiwa; Takayuki Nabeya, all of Yokohama, Japan

[73] Assignee: Kabushiki Kaisha Toshiba, Kawasaki, Japan

[21] Appl. No.: 08/936,895

[22] Filed: Sep. 25, 1997

[51] Int. Cl.[6] .................................................. G11C 29/00
[52] U.S. Cl. ........................................... 714/718; 714/711
[58] Field of Search ..................................... 714/718, 711

[56] References Cited

U.S. PATENT DOCUMENTS

| 4,460,997 | 7/1984 | Harns | 714/704 |
| 4,628,509 | 12/1986 | Kawaguchi | 714/719 |

FOREIGN PATENT DOCUMENTS

| 5-101692 | 4/1993 | Japan . |
| 5-325594 | 12/1993 | Japan . |
| 6-275096 | 9/1994 | Japan . |
| 8-185700 | 7/1996 | Japan . |

*Primary Examiner*—Phung M. Chung
*Attorney, Agent, or Firm*—Foley & Lardner

[57] ABSTRACT

The processing for deciding the remedy as being possible or impossible and the processing for remedying bit fails can be both executed in a short time on the basis of bit mask processing. Fail data are transferred from the tester to the redundancy processor (in Step S101), and the number of the fail addresses stored in the buffer memory is compared with the maximum number of fail bits (in Step S103). Further, the line fail detection and the remedy processing are both executed (in Step S105), and the redundancy processor decides whether the number of the line fails exceeds the number of the spare rows and the number of the spare columns or not (in Step S107). Further, the bit mask processing is executed for the fail addresses (in Step S109) to decide the remedy possibility (in Step S111). Here, the maximum remediable number of the bit mask processings can be calculated on the basis of "the number of row spares R+the number of the column spares". When the number of the bit mask processing exceeds this calculated limit value, the remedy is decided as being impossible (in Step S121), so that any bit fail remedy processing is not more executed at the succeeding stage.

44 Claims, 17 Drawing Sheets

TOTAL NUMBER OF FAIL BITS = 8

NUMBER OF REMEDIABLE BIT MASK PROCESSING = 4 TIMES

COMPARE → REMEDY IS IMPOSSIBLE

NUMBER OF BIT MASK PROCESSING = 5 TIMES

```
TOTAL NUMBER OF FAIL BITS = 4

NUMBER OF REMEDIABLE BIT MASK PROCESSING = 4 TIMES
                          ↕
                    [ COMPARE ] ──→ REMEDY IS IMPOSSIBLE
NUMBER OF BIT MASK PROCESSING = 4 TIMES

SPARE FAIL = ONE BIT
```

TOTAL NUMBER OF FAIL BITS = 4

NUMBER OF REMEDIABLE BIT MASK PROCESSING = 4 TIMES

COMPARE → REMEDY IS IMPOSSIBLE

NUMBER OF BIT MASK PROCESSING = 4 TIMES

INTERSECTION FAIL OF SPARE ROW AND SPARE COLUMN = ONE BIT (COMBINATIONS FOR BIT FAIL REMEDY)

R1-R2-C1-C2
R1-R2-C2-C1
R2-R1-C1-C2
R2-R1-C2-C1
R1-C1-R2-C2
⋮
R1-C1-C2-R2
⋮
C1-R1-R2-C2
⋮
C1-R1-C2-R2
⋮
C1-C2-R1-R2
⋮

} 24 COMBINATIONS IN TOTAL

FIG. 9

| (COMBINATIONS FOR BIT FAIL REMEDY) | (REMEDY RESULTS) | (NUMBER OF USABLE SPARES) |
|---|---|---|
| R1-R2-C1-C2 | ··· REMEDIABLE | 4 |
| R1-R2-C2-C1 | ··· REMEDIABLE | 4 |
| R2-R1-C1-C2 | ··· REMEDIABLE | 4 |
| R2-R1-C2-C1 | ··· REMEDIABLE | 4 |
| R1-C1-R2-C2 | ··· REMEDIABLE | 3  COMBINATION END |
| ⋮ | | |
| R1-C1-C2-R2 | | |
| ⋮ | | |
| C1-R1-R2-C2 | | |
| ⋮ | | |
| C1-R1-C2-R2 | — NO MORE PROCESSING | |
| ⋮ | | |
| C1-C2-R1-R2 | | |
| ⋮ | | |

FIG. 10

SEMICONDUCTOR TEST SYSTEM AND METHOD, AND MEDIUM FOR RECORDING TEST PROGRAM THEREFOR

BACKGROUND OF THE INVENTION

1. Field of the Invention

The present invention relates to a semiconductor test system, a semiconductor test method, and a medium for recording a semiconductor test program used for the same system and method. More specifically, the present invention relates to a tester used in a test process for semiconductor devices each provided with a redundant circuit, and more particularly to a redundancy processor for deciding whether a device can be replaced with a redundant circuit provided for the device or not on the basis of fail data of the device to be measured, a redundancy processing method therefor and a medium for recording a redundancy processing program therefor.

2. Description of the Prior Art

In the conventional test process for a wafer on which ICs, LSIs, etc. each provided with a redundancy circuit are formed, in general a redundancy processing is executed to decide whether the defective positions of the wafer can be remedied or not.

In the above-mentioned wafer test process, an LSI tester is usually used. Here, the LSI tester has a buffer memory, and the defective data or fail data obtained when each device is tested are stored in this buffer memory. Therefore, on the basis of these stored fail data, it is possible to decide whether the device can be replaced with a redundancy circuit provided for each device or not.

Recently, however, the time required for the test and remedy decision processing has been increased more and more with increasing device capacity and increasing complexity of the redundant circuit. To overcome this problem, therefore, the LSI tester is generally provided with a dedicated redundancy processor used for only the remedy decision processing. In this case, it is possible to shorten the apparent time required for the test system processing, by executing the parallel processing of both the device test and the remedy decision processing at the same time.

FIG. 14 is a schematic block diagram showing an example of prior art test system composed of a tester 1 and a redundancy processor 2.

The tester 1 is composed of a controller 1a, a test section 1b, and a buffer memory 1c for storing the fail data. In the practical test, a device to be measured (e.g., IC, LSI, etc.) is set to the test section 1b, to store the fail data of the set device in the buffer memory 1c under control of the controller 1a. Here, for instance, the fail data are data indicative of whether memory cells are normal or abnormal at the respective rows and columns, respectively.

The redundancy processor 2 is composed of a buffer memory 2a for storing the fail addresses and a controller 2b. The controller 2b controls the total operation of the redundancy processor 2. Here, the buffer memory 2a stores fail addresses on the basis of the fail data transferred from the buffer memory 1c of the tester 1. In this case, the redundancy processor 2 stores only the fail addresses in the buffer memory 2a, to execute the remedy decision processing on the basis of these stored data. Here, although the necessary capacity of the buffer memory 2a can be decided on the basis of the number of the fail addresses to be stored, in general this number of the fail addresses increases with increasing capacity of the device to be measured. Therefore, there so far exists a problem in that the cost of the tester increases with increasing capacity of the buffer memory 2a, and further the throughput of the tester decreases with increasing time required to read the fail addresses.

FIG. 15 is a diagram showing the operation of the test system. As shown in FIG. 15, by the tester 1, a function test (1) of the device (e.g., IC, LSI, etc.) set to the test section 1b for test is executed by the controller 1a, so that the predetermined fail data can be stored in the buffer memory 1c. Further, when a function test (2) is being executed, the fail data obtained by the first function test (1) and stored in the buffer memory 1c are transferred to the redundancy processor 2. In the redundancy processor 2, the remedy processing (1) such as the remedy decision, the replacement with the spares, etc. is executed in cooperation with the buffer memory 2a. In the same way as above, the other function tests (3) to (n) are executed by the tester 1, and the other remedy processing (3) to (n) are executed by the redundancy processor in sequence.

FIGS. 16(a) and 16(b) are data construction tables of the fail data of the prior art tester (i.e., the buffer memory 1c) and the redundancy processor (i.e., the buffer memory 2a), respectively. In these drawing, the memory or, having 64 addresses in total (i.e., the row and column addresses are both eight) is shown by way of example. Further, the number of spares is assumed to be two in both the row and column, respectively. Here, the assumption is made that the fail data as shown by a mark [*] in FIG. 16(a) are stored in the buffer memory 1c of the tester 1. Therefore, when these fail data are transferred to the buffer memory 2a of the redundancy processor 2, all the fail addresses are stored in the buffer memory 2a. In this example, as shown by the actual data stored in FIG. 16(b), the addresses of 14 in total are stored on the basis of the numbers of the row and column, respectively.

FIG. 17 is a flowchart for assistance in explaining the remedy decision processing by the prior art redundancy processor.

First, in Step (S01), data are transferred from the tester (1) to the redundancy processor 2, that is, from the buffer memory (fail data) 1c to the buffer memory (fail address) 2a. After that, in Step (S02), the number of the fail addresses is checked as to whether exceeding the maximum number of the remediable addresses. Here, the maximum number of the remediable addresses can be obtained by the following formula:

$$\text{Max remediable number} = $$
$$\text{max value of row address} \times \text{number of column spares} + $$
$$\text{max value of column address} \times \text{number of row spares}$$

For instance, in the case of the example shown in FIGS. 16(a) and 16(b), the maximum remediable number is 32= (8×2)+(8×2). Therefore, when the number of the fail addresses exceeds this maximum remediable number, in Step (S08), the remedy is decided to be impossible.

Successively, in Step (S03), on the basis of the fail addresses stored in the buffer memory 2a, the line fail is detected, and spares are allocated to the detected line fail for remedy processing.

Here, "line fail" is defined as follows: when the replaced row spares or the replaced column spares are allocated to the fail addresses, since the number of fails at the same address (i.e., on the same line) is too many, the whole line replacement is indispensable. Further, the fail addresses other than the "line fail" are referred to as "bit fails", for discrimination between the two. Here, the conditions that the "line fail" is decided are that the number of fails on the same row address exceeds the number of column spares in the case of the row addresses and that the number of fails on the same column address exceeds the number of row spares in the case of the column addresses.

Further, when either one of the numbers of the row line fails or the column line fails exceeds the number of the row or column spares, in Step (S04), the remedy is decided to be impossible.

Finally, in Step (S05), the remedy processing is executed by allocating the remaining usable spares to the bit fails. In this case, in general the remedy processing is executed on the basis of all the combinations of the remaining spares. Further, when the actual remedy can be executed in Step (S06), the device remedy is decided as being possible in Step (S07).

However, recently, there exists such a tendency that the number of the spares increases with increasing capacity of the memory device. Therefore, in the case of the prior art test system, since the remedy decision of the bit fails is executed by allocating all the usable spares to all the fail addresses on the basis of the total combinations of the spare rows and the spare columns, the number of the combinations increases with increasing numbers of the bit fails and spares, so that a long remedy processing time is inevitably required. As a result, there exists a problem in that when a device eventually decided as a defective device is tested, the defective device can be decided as being non-remedy (i.e., the remedy is impossible) after all the combinations of the spare rows and the spare columns has been executed.

Further, in general when the remedy solution is obtained for bit fail remedy, it is necessary to select any suitable solution by which the number of used spare lines can be minimized, from among some remedy solutions. In this case, since all the spare combinations must be executed, the number of the spare combinations increases with increasing number of spares, with the result that a long remedy processing time is needed.

In more detail, in the bit fail remedy processing for obtaining one remedy solution, when all the combinations of the remaining spares are allocated and further the remaining bit fail no more exists during the combination processing of the remaining spares, the combination obtained at this time becomes one of the remedy solutions. Here, the number of these combinations increases with increasing number of the remaining rows, increasing number of the spare columns, and increasing number of the remaining bit fails. Therefore, since the non-remedy or the impossible remedy is decided only after all the combination processings have been executed, there exists problems in that the throughput is reduced and further the remedy processing cannot be completed within an FC test time.

Further, in the prior art semiconductor test system, since there exists a tendency that the number of the spares increases with increasing capacity of the memory device, when the wafer is tested by use of the prior art redundancy processor, the capacity of the buffer memory for storing the fail addresses inevitably increases. In addition, when the capacity of the buffer memory increases, since the number of the buffer memory devices increases, there arises another problems in that the number of the substrates thereof increases and the casing of the buffer memory devices is large-sized, with the result that the cost of the buffer memory inevitably increases.

Further, in the prior art test system, the remedy decision processing for the bit fails is executed by allocating usable spares to the fail addresses. In this case, however, since the allocation processing is executed for all the combinations of the row spares and the column spares, there exists the other problem in that the number of the allocation combinations increases and thereby the processing time inevitably increases with increasing number of the spares.

SUMMARY OF THE INVENTION

With these problems in mind, therefore, it is a first object of the present invention to provide a semiconductor test system and method, by which the remedy decision processing can be executed on the basis of the comparison between the number of bit mask processings and the maximum number of remediable processings, so that the remedy decision processing can be executed in a short time.

Further, a second object of the present invention is to provide a semiconductor test system and method, by which the bit fail remedy processing can be executed on the basis of the number of bit mask processings and further when the number of the remedy solutions is the same as the number of the bit mask processings, the remedy solution can be obtained by completing all the combination processings (before the combination processings will be all executed), so that the remedy decision processing can be executed in a short time.

Further, a third object of the present invention is to provide a semiconductor test system and method, by which the number of the fail addresses stored in the buffer memory of the redundancy processor can be minimized to reduce the necessary capacity of the buffer memory, so that the cost performance of the redundancy processor can be increased.

Further, a fourth object of the present invention is to provide a semiconductor test system and method, by which the remedy decision processing is executed by use of the maximum number of the storable data, so that the remedy decision processing can be executed in a short time.

To achieve the above-mentioned first and second objects, the present invention provides a method of testing a semiconductor device, comprising: a step of executing bit matrix processing for erasing addresses each having fail data in both row and column direction lines on the basis of fail data and fail data addresses; and a step of executing remedy possibility decision for comparing the number of bit matrix processing times executed in the above bit matrix processing step with the number of remediable processing times obtained by adding the number of row spares and the number of column spares, and for deciding that fail remedy is impossible only when the number of the bit matrix processing times exceeds the number of the remediable processing times.

Further, the present invention provides a method of testing a semiconductor device, comprising: a step of executing line fail remedy processing for detecting and remedying line fails on the basis of fail data and fail data addresses both obtained by a semiconductor device having a redundancy circuit and transferred from a tester; a step of executing bit matrix processing for erasing fails at the respective fail addresses each having a bit fail and not yet remedied in the above line fail remedy processing step, from among the fail addresses each having the fail data, in both row and column direction lines, respectively; and a step of executing remedy possibility decision processing for comparing the number of bit matrix processing times executed in the above bit matrix processing step with the number of remediable processing times obtained by adding the number of row spares and the number of column spares both still remaining after having been used in the above line fail remedy processing step, and for deciding that fail remedy is impossible only when the number of the bit matrix processing times exceeds the number of the remediable processing times.

Further, the present invention provides a semiconductor test system, which comprises: first storing means for storing fail addresses each having fail data on the basis fail data and fail data addresses; second storing means for storing an addition value of both the number of row spares and the number of column spares, as the number of remediable processing times; bit matrix processing means for causing a computer to erase fails in both row and column direction lines at the respective fail addresses stored in said first storing means; third storing means for storing the number of bit matrix processing times executed by said bit matrix processing means; and remedy possibility deciding means for causing a computer to compare the number of bit matrix processing times stored in said third storing means with the number of remediable processing times stored in said second storing means, to decide that fail remedy is impossible only when the number of the bit matrix processing times exceeds the number of the remediable processing times.

Further, the present invention provides a semiconductor test system, which comprises: first storing means for storing fail addresses each having fail data on the basis fail data and fail data addresses both obtained by a semiconductor device having a redundancy circuit and transferred from a tester; line fail remedy processing means for causing a computer to detect line fails on the basis of the fail data and the fail addresses; second storing means for storing an addition value of both the number of row spares and the number of column spares both still remaining after used by said line fail remedy processing means, as the number of remediable processing times; bit matrix processing means for causing a computer to erase fails at the respective fail addresses each having a bit fail not yet remedied by said line fail remedy processing means, from among the fail addresses each having the fail data, in both row and column direction lines; third storing means for storing the number of bit matrix processing times executed by said bit matrix processing means; and remedy possibility deciding means for causing a computer to compare the number of bit matrix processing times stored in said third storing means with the number of remediable processing times stored in said second storing means, to decide that fail remedy is impossible only when the number of the bit matrix processing times exceeds the number of the remediable processing times.

Further, the present invention provides a memory medium for recording a semiconductor test program, which comprises: bit matrix processing means for causing a computer to erase addresses each having fail data in both row and column direction lines on the basis of fail data and fail data addresses; and remedy possibility deciding means for causing a computer to compare the number of bit matrix processing times executed by said bit matrix processing means with the number of remediable processing times obtained by adding the number of row spares and the number of column spares and to decide that fail remedy is impossible only when the number of the bit matrix processing times exceeds the number of the remediable processing times.

Further, the present invention provides a memory medium for recording a semiconductor test program, which comprises: line fail remedy processing means for causing a computer to detect and remedy line fails fail on the basis of fail data and fail data addresses both obtained by a semiconductor device having a redundancy circuit and transferred from a tester; bit matrix processing means for causing a computer to erase fails at the respective fail addresses each having a bit fail and not yet remedied by said line fail remedy processing means, from among the fail addresses each having the fail data, in both row and column direction lines, respectively; and remedy possibility decision processing means for causing a computer to compare the number of bit matrix processing times executed by said bit matrix processing means with the number of remediable processing times obtained by adding the number of row spares and the number of column spares both still remaining after having been used by said line fail remedy processing means, and to decide that fail remedy is impossible only when the number of the bit matrix processing times exceeds the number of the remediable processing times.

Further, to achieve the third and fourth objects, the present invention provides a semiconductor test system, which comprises: counting means for causing a computer to count the number of fails at addresses on the basis of addresses and fail data at each address both transferred from a tester; detecting means for causing a computer to decide a line fail on the basis of a value counted by said counting means; storing means for storing fail addresses each having fail data; and control means for causing a computer to write the fail addresses in said storing means in sequence on the basis of the addresses transferred by the tester and decision results of said detecting means.

Further, the present invention provides a semiconductor test system, which comprises: fail data storing means for storing fail data of a semiconductor device having a redundancy circuit; detecting means for causing a computer to count the number of fails at each row address and the number of fails at each column address, respectively on the basis of fail address data indicative of defective addresses of the semiconductor device and transferred from said fail data storing means; storing means for storing the fail addresses; and control means for causing a computer to control data writing processing in such a way that when the value counted by said detecting means is less than a predetermined value, the fail addresses are stored in said storing means in sequence; on the other hand, when the value counted by said detecting means exceeds the predetermined value, the fail addresses are not stored in said storing means.

Further, the present invention provides a method of testing a semiconductor device, which comprises: a step of counting the number of fails at addresses on the basis of addresses and fail data at each address both transferred from a tester; a step of deciding a line fail on the basis of the counted value; a step of storing fail addresses each having fail data; and a step of storing the fail addresses on the basis of the addresses transferred by the tester and decision results of the line fails.

Further, the present invention provides a method of testing a semiconductor device, which comprises: a step of storing fail data of a semiconductor device having a redundancy circuit; a step of counting the number of fails at each row address and the number of fails at each column address, respectively on the basis of fail address data indicative of defective addresses of the semiconductor device and contained in the fail data; and a step of controlling data writing processing in such a way that when the counted value is less than a predetermined value, the fail addresses are stored; on the other hand, when the counted value exceeds the predetermined value, the fail addresses are not stored.

Further, the present invention provides a memory medium for recording a semiconductor test program, which comprises: counting means for causing a computer to count the number of fails at addresses on the basis of addresses and fail data at each address both transferred from a tester; deciding means for causing a computer to decide a line fail on the basis of the counted value; storing means for storing fail addresses each having fail data; and storing means for storing the fail addresses on the basis of the addresses transferred by the tester and decision results of the line fails.

Further, the present invention provides a memory medium for recording a semiconductor test program, which comprises: storing means for storing fail data of a semiconductor device having a redundancy circuit; counting means for causing a computer to count the number of fails at each row address and the number of fails at each column address, respectively on the basis of fail address data indicative of defective addresses of the semiconductor device and contained in the fail data; and control means for causing a computer to control data writing processing in such a way that when the counted value is less than a predetermined value, the fail addresses are stored; on the other hand, when the counted value exceeds the predetermined value, the fail addresses are not stored.

BRIEF DESCRIPTION OF THE DRAWINGS

FIG. 3($b$) is an illustration for assistance in explaining the bit mask processing for erasing fail bits;

FIG. 9 is an illustration for assistance in explaining the replacement combinations required for the prior art bit fail remedy processing method;

FIG. 10 is an illustration for assistance in explaining the replacement combinations required for the bit fail remedy processing method according to the present invention;

FIG. 11($b$) is an illustration for assistance in explaining the maximum number of data storable in the buffer memory of the redundancy processor, in which only the bit fails exist;

FIG. 12($b$) is an illustration for assistance in explaining the operation of the buffer memory of the redundancy processor, in which the number of data stored in the buffer memory thereof does not exceed the upper limit thereof;

FIG. 13($b$) is an illustration for assistance in explaining the operation of the buffer memory of the redundancy processor, in which the number of data stored in the buffer memory thereof exceeds the upper limit thereof;

FIG. 16($b$) is an illustration showing a fail data construction stored in the buffer memory of the prior art redundancy processor.

DETAILED DESCRIPTION OF THE PREFERRED EMBODIMENTS

Embodiments of the semiconductor test system according to the present invention will be described hereinbelow with reference to the attached drawings.

Figure 1:
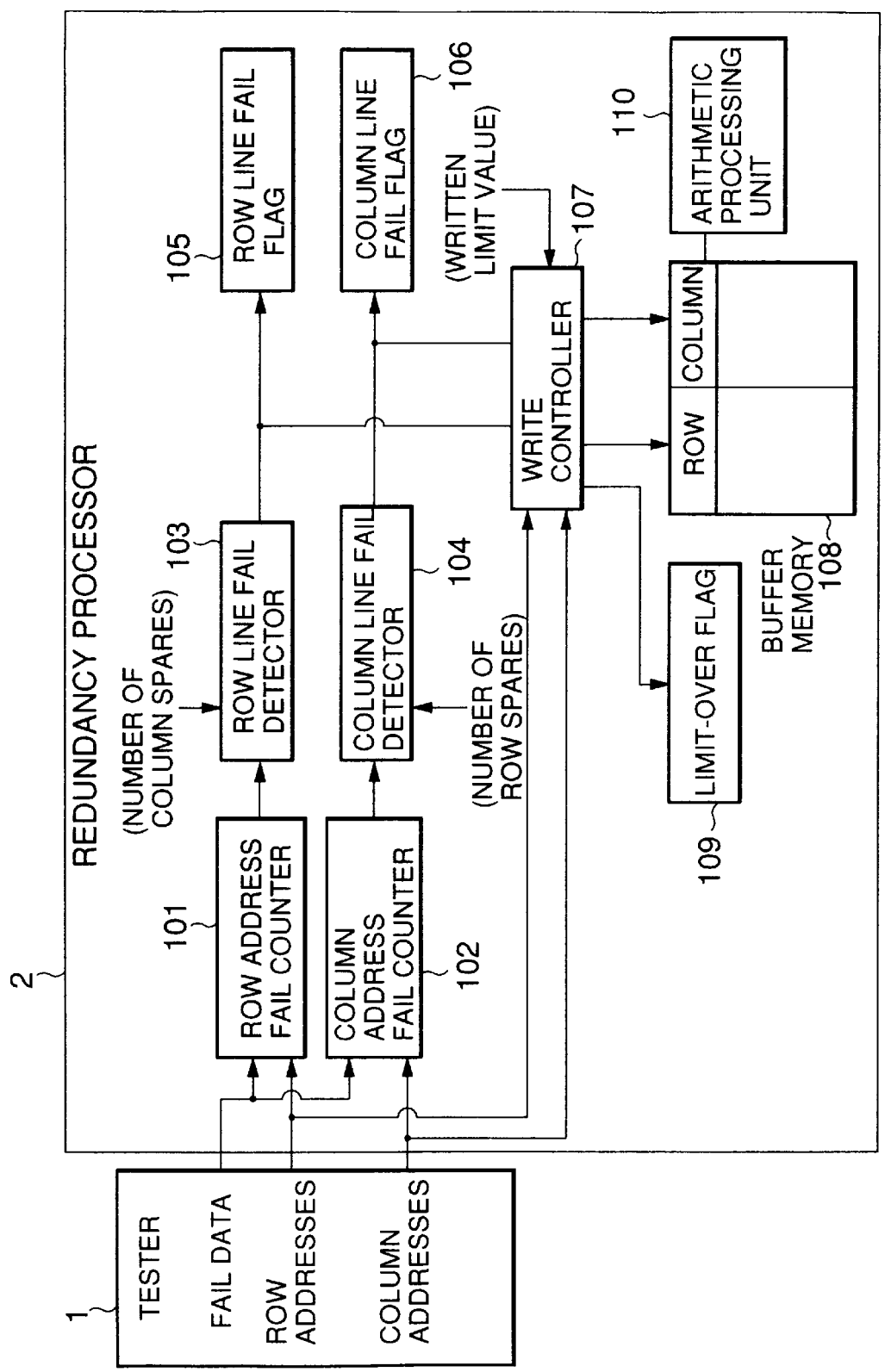
FIG. 1 is a block diagram showing a redundancy processor according to the present invention.
Figure 14:
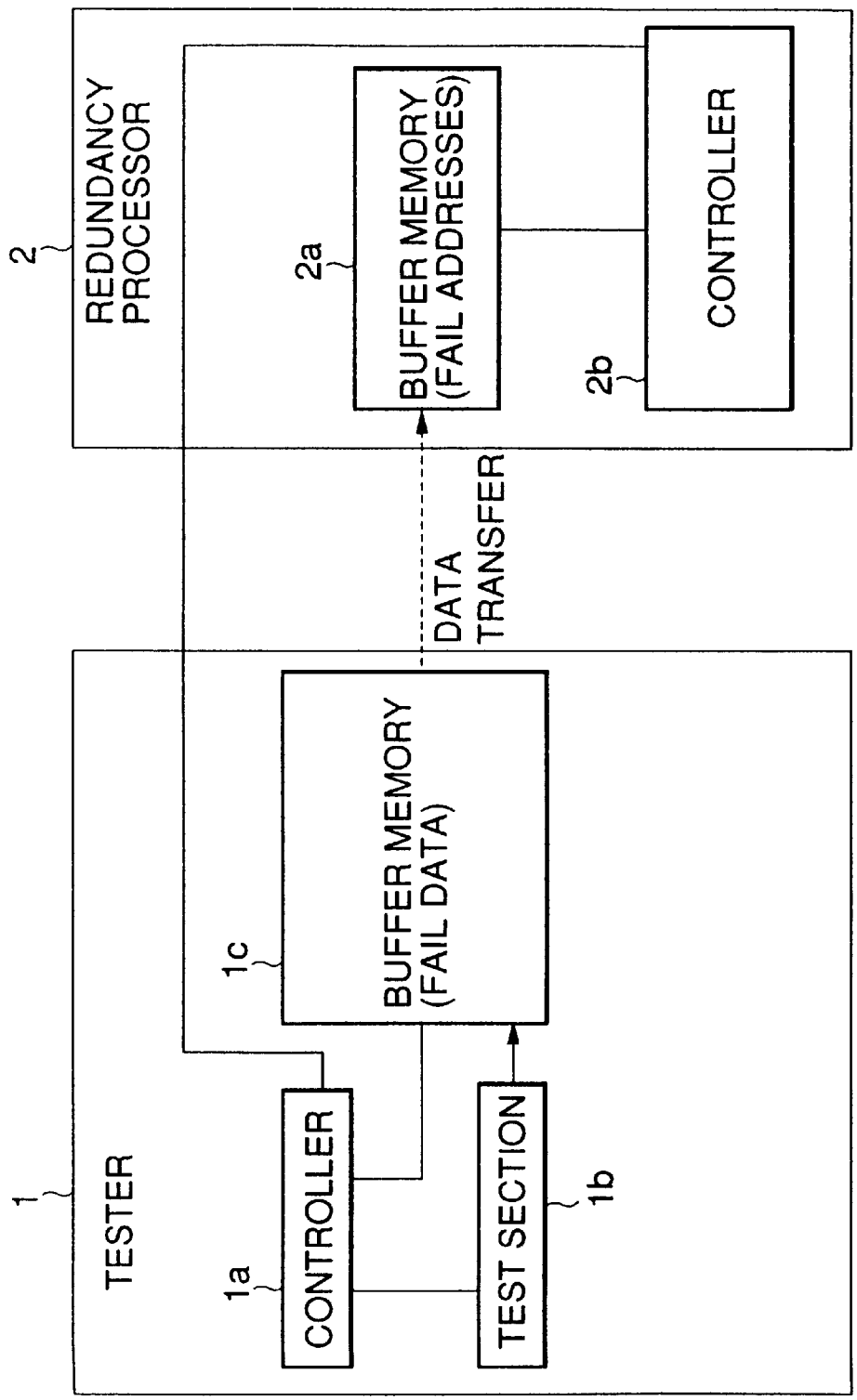
FIG. 14 is a block diagram showing a prior art test system.
Figure 15:
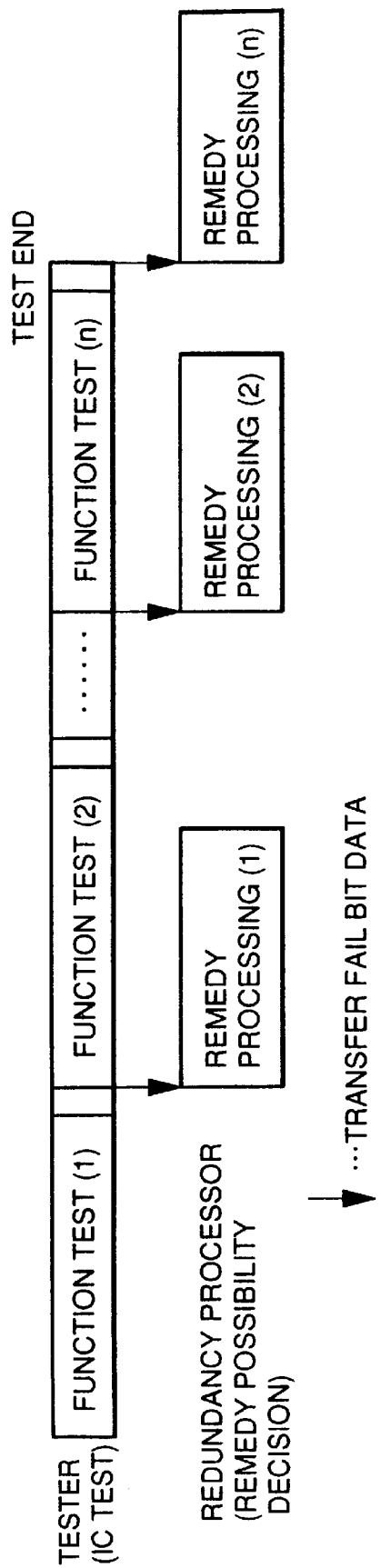
FIG. 15 is an illustration for assistance in explaining the operation of the prior art test system shown in FIG. 14.
Figures 16A, 16B:
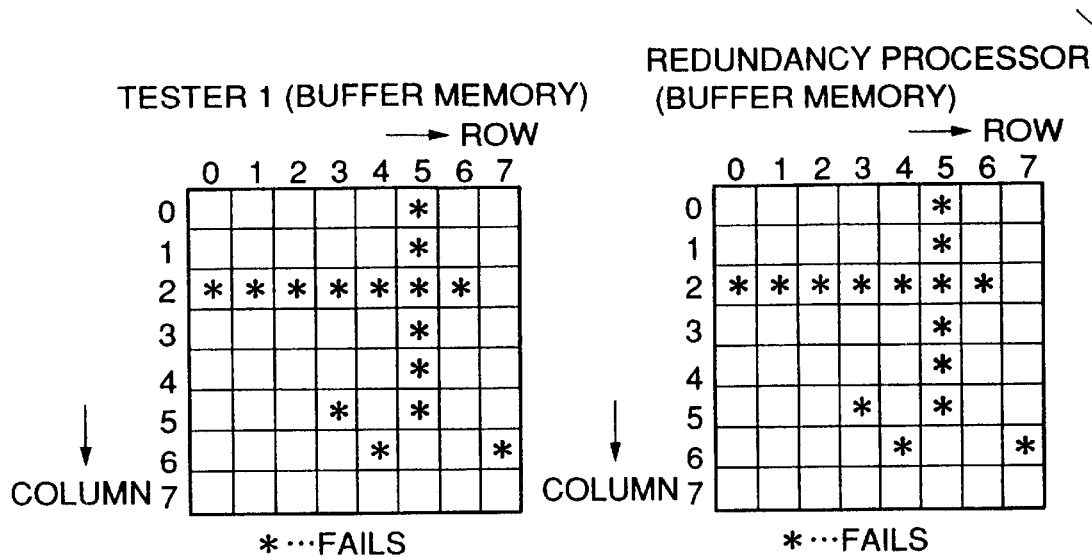
FIG. 16($a$) is an illustration showing a fail data construction stored in the buffer memory of the prior art tester.
Figure 17:
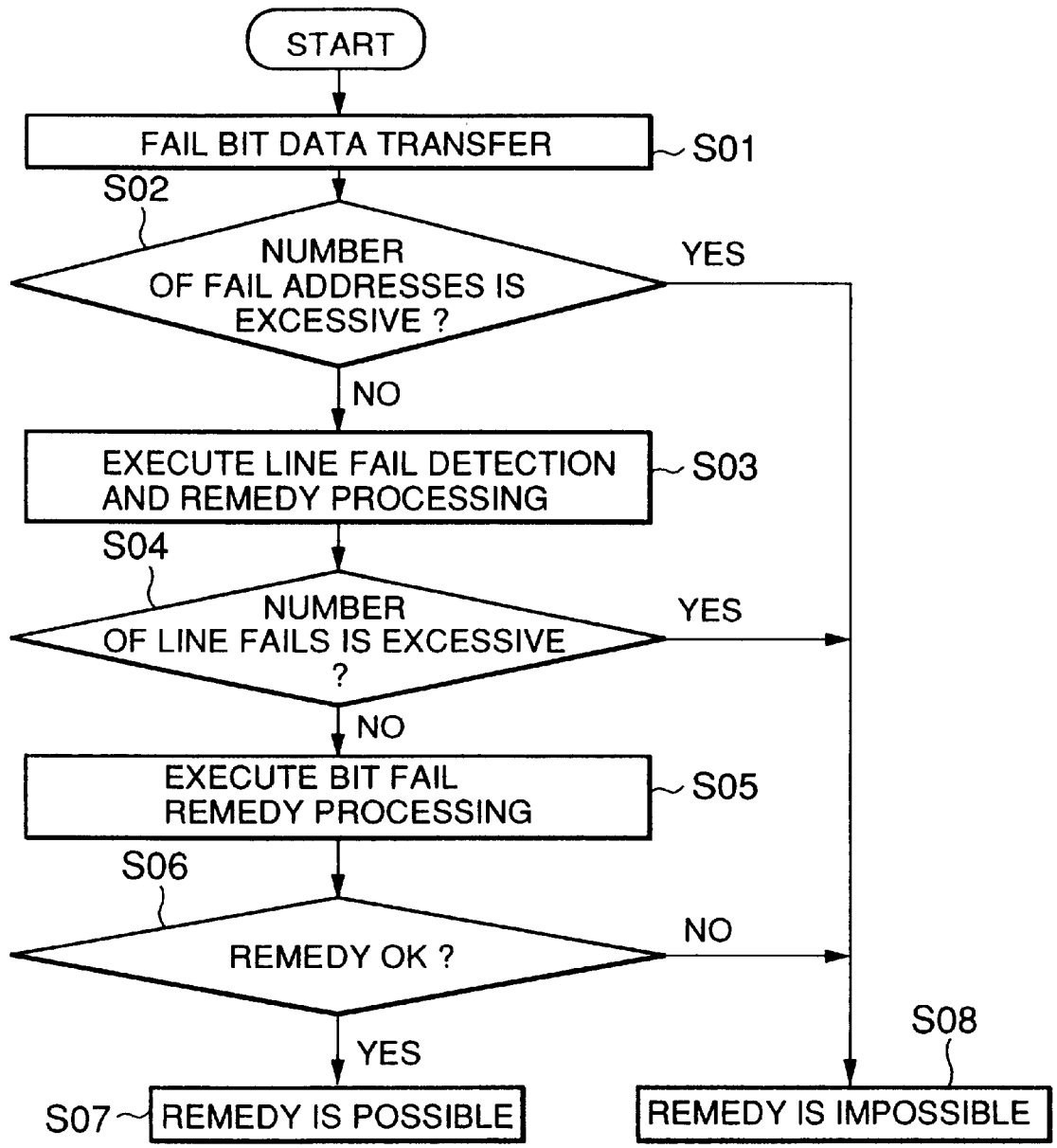
FIG. 17 is a flowchart showing the remedy decision processing executed by the prior art redundancy processor shown in FIG. 14.

FIG. 1 is a schematic block diagram showing the redundancy processor of the test system according to the present invention. Here, the total block diagram of the test system composed of the tester and the redundancy processor according to the present invention is basically the same as shown in FIG. 14. In other words, in the tester 1, devices (i.e., ICs, LSIs, etc.) to be tested are set to the test section 1$b$, and then fail data are stored in the buffer memory 1$c$ under control of the controller 1$a$. On the other hand, in the redundancy processor 2, a buffer memory 2$a$ or 108 stores fail addresses on the basis of the fail data transferred from the buffer memory 1$c$ of the tester 1. In this case, in the redundancy processor 2, only the fail addresses are stored in the buffer memory 2$a$ or 108, and the remedy possibility is decided on the basis of only the stored fail addresses.

Being different from the prior art redundancy processor, however, the redundancy processor 2 according to the present invention further comprises a row address fail counter 101, a row line fail detector 103, a row line fail flag 105 for the row addresses, and a column address fail counter 102, a column line fail detector 104, and a column line fail flag 104 for the column addresses. In addition, the redundancy processor 2 comprises a write controller 107, a buffer memory 108, a limit-over flag 109, an arithmetic processing unit 110. Further, some appropriate means for storing the number of column spares, the number of row spares, and a value of written limit are provided.

The row address fail counter 101 inputs fail data designated by the row addresses for each row address transferred in sequence from the buffer memory of the tester. In the same way, the column address fail counter 102 inputs fail data designated by the column addresses for each column address transferred in sequence from the buffer memory of the tester 1. Further, only when the fail data indicates "fail" (e.g., abnormal, trouble, defective, etc.), the row address fail counter 101 counts the number of the fails of the designated row address. In the same way, only when the fail data indicates "fail" (e.g., abnormal, trouble, defective, etc.), the column address fail counter 102 counts the number of fails of the designated column address.

The row line fail detector 103 decides the line fail on the basis of the number of the fails counted by the row address fail counter 101. In the same way, the column line fail detector 104 decides the line fail on the basis of the number of the fails counted by the column address fail counter 102. In the line fail decision, the number of fails of the row address is compared with the number of column spares. On the other hand, the number of fails of the column address is compared with the number of row spares.

When the row line fail detector 103 decides the row line fail, a flag "1" is set to the row line fail flag 105 at the corresponding row address. In the same way, when the column line fail detector 104 decides the column line fail, a flag "1" is set to the column line fail flag 106 at the corresponding column address. For instance, in the case where the number of the row spares is two, when the column line fail detector 104 detects the third fail address at the same column address, the flag "1" is set to the corresponding column address of the column line fail flag 106.

The write controller 107 stores the fail addresses in the buffer memory 108 on the basis of the decision results of the row line fail detector 103 and the column line fail detector 104.

In more detail, in general, when the fail data transferred from the tester 1 are "fail", the designated row and column addresses are stored in sequence in the buffer memory 108. In this case, however, when the fails are decided to be replaced as the line fails on the basis of the decision of the row line fail detector 103 or the column line fail detector 104, since the corresponding row or column fail addresses are to be replaced at this time point and thereby it is unnecessary to store these addresses in the buffer memory 108, these addresses are not stored in the buffer memory 108 under control of the write controller 107. Here, the fact that the row or the line is "line fail" can be decided with reference to the row or column line fail flag 105 or 106.

Further, when the write controller 107 decides that the number of fails exceeds the maximum remediable number, a flag "1" is set to the limit-over flag 109. Therefore, when this flag is set, it is possible to immediately decide that the device cannot be remedied.

On the basis of the stored contents of the buffer memory 108, the row line fail flag 105 and the column line fail flag 106, the arithmetic processing unit 110 executes appropriate processing to remedy the device by the replacement with the spares. In this case, on the basis of the fail addresses stored in the buffer memory 108, the arithmetic processing unit 110 executes the remedy decision, the bit fail remedy processing, etc.

Here, the conversion of the fail addresses to the bit matrix will be explained hereinbelow with reference to FIG. 2.

In the redundancy function of the LSI tester according to the present invention, after the line fail decision and the remedy decision have been both executed on the basis of the fail data (i.e., the row addresses and the column addresses) transferred from the buffer memory for storing fail data in the tester to the redundancy processor, the bit fails (other than the line fails) are converted into bit matrix data developed to row and/or column bits on the arithmetic processing unit 110. In other words, the fail addresses stored in the buffer memory 108 are converted into a bit matrix developed to the row addresses and the column addresses by the arithmetic processing unit 110. In FIG. 2, [*] indicates each fail address position.

Figures 3A, 3B:
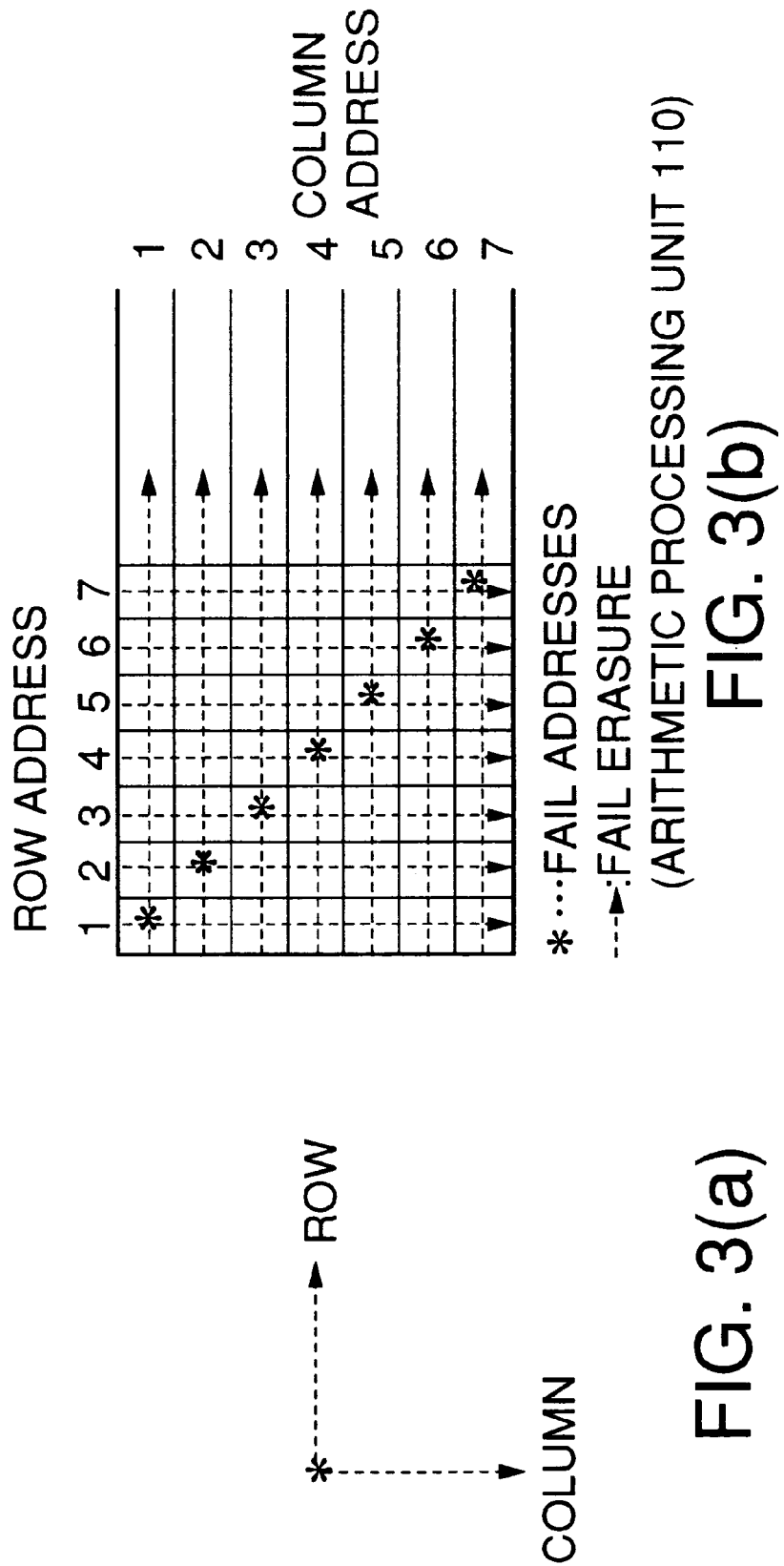
FIG. 3($a$) is an illustration showing a fail retrieved on a bit matrix.

FIGS. 3(a) and 3(b) are illustrations for assistance in explaining the bit mask processing for erasing fail bits.

The arithmetic processing unit 110 executes the remedy decision for the bit fails developed to the bit matrix. In this processing, the bit mask processing is executed.

In the present invention, before the bit fail remedy is executed, the necessary number of spares can be decided by calculating the minimum possible number of spares required for the bit fails. Therefore, it is possible to execute the redundancy processing at a high speed, in comparison with the prior art redundancy processing.

As shown in FIG. 3(a), a bit fail is retrieved on the bit matrix. Further, as shown in FIG. 3(b), the bit mask processing is executed by erasing all the fail bits in both the row and column directions for all the fails retrieved on the bit matrix. In general, when the retrieved bit fail is remedied, although the bit fail can be replaced with a spare row or a spare column, at this time, it is not yet decided whether the bit fail is replaced with the spare row or the spare column.

Figure 2:
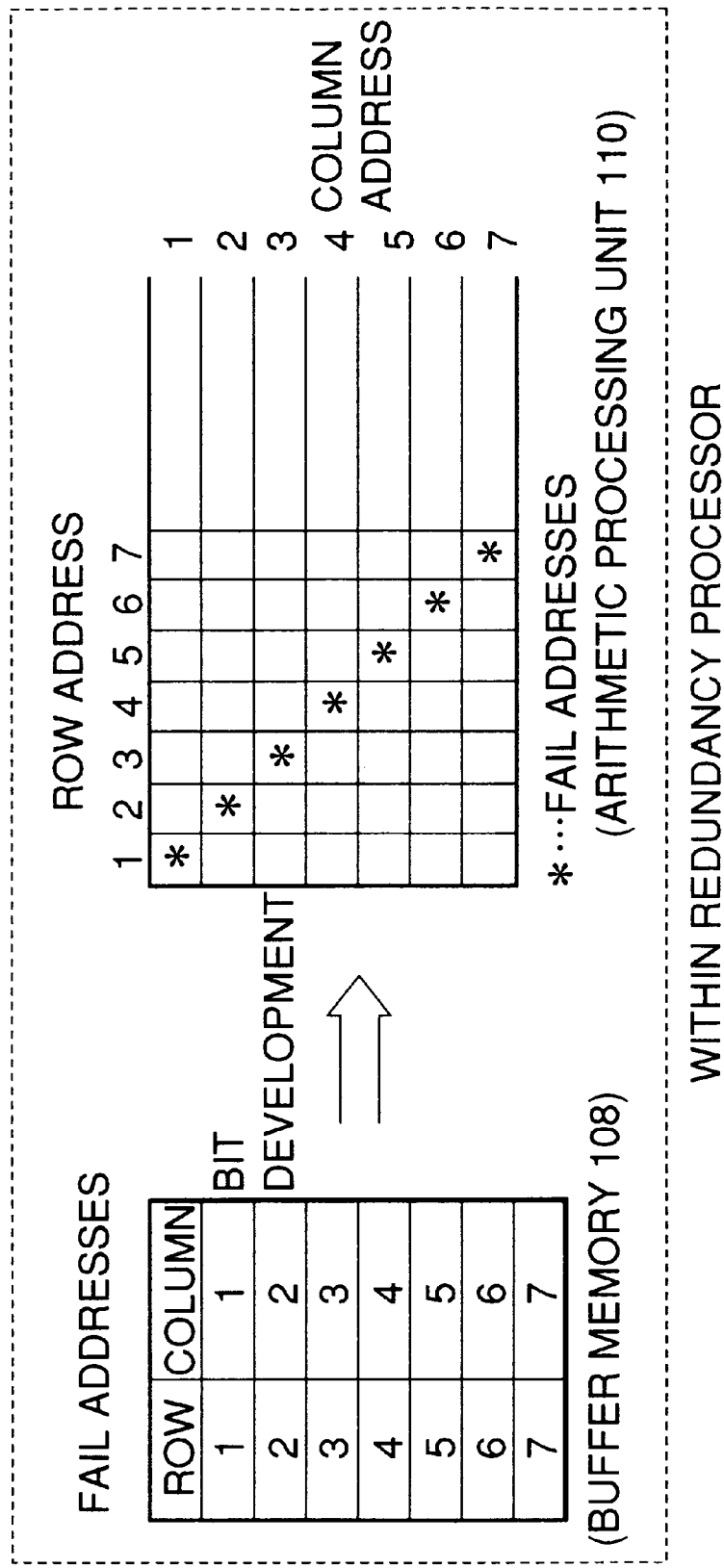
FIG. 2 is an illustration for assistance in explaining the conversion (development) of the fail addresses into a bit matrix.

For instance, in the case of the bit matrix as shown in FIG. 2, the bit mask processing is executed in sequence for all the fail bits as shown in FIG. 3(b). Here, it is possible to obtain the number of bit mask processings for erasing all the fail bits existing on the bit matrix. Therefore, the number of the bit mask processings becomes the number of spares required to remedy all the fail bits on the bit matrix. Further, the number of the maximum remediable bit mask processings by use of the remaining spare rows and the remaining spare columns (remaining after the line fails have been remedied) can be expressed by the following formula:

$$\text{Max number of remediable bit mask processings} = R + C$$

where R denotes the number of remaining row spares, and C denotes the number of remaining column spares.

In the present invention, it is possible to decide the remedy possibility on the basis of this value.

In practice, the number of the maximum remediable bit mask processings is previously calculated as a limit value on the basis of the numbers of the remaining spares (R and C) usable in a spare-replaceable closed unit (referred to as one processing unit, hereinafter), and the remedy is decided as being impossible when the number of the actual bit mask processings exceeds the calculated limit value.

Further, when the number of the actual bit mask processings is less than the calculated limit value, the bit fail remedy can be executed. In the case of the bit fail remedy, the number of the bit mask processings calculated by the bit mask processings becomes the number of the necessary spares. That is, the number of the necessary spares is the minimum number of spares required when the bit fails are remedied. Therefore, when the spares are combined with each other for the bit fail remedy, this number of the necessary spares is used as a stop (i.e., limit) value. That is, this stop value is compared with the number of the minimum spares for each combination. When both the numbers match, the combination processing is completed, and the number of the necessary spares is outputted as a remedy solution (i.e., the minimum number of the usable spares).

Figure 4:
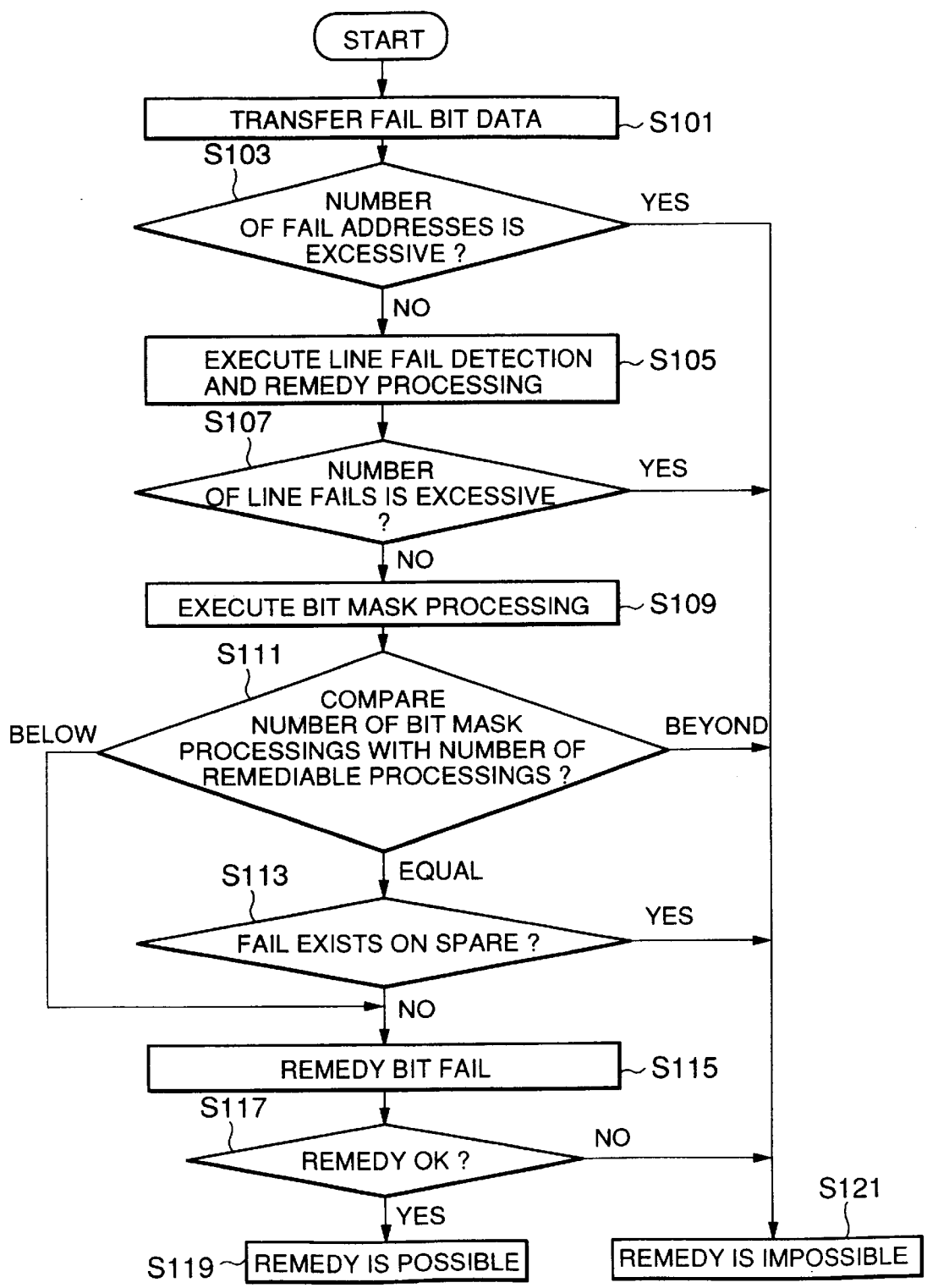
FIG. 4 is a flowchart showing the remedy decision processing executed by the method according to the present invention.

FIG. 4 is a flowchart showing the remedy decision processing according to the present invention, by which the operation of the arithmetic processing unit 110 will be described in further detail hereinbelow.

In the following description, the assumption is made that a memory has 64 addresses in total, in which the row address is "0" in its minimum and "7" in its maximum and the column address is "0" in its minimum and "7" in its maximum. Further, the number of spares is two in both the spare row and the spare column, respectively.

(1st example)

Figures 5A, 5B:
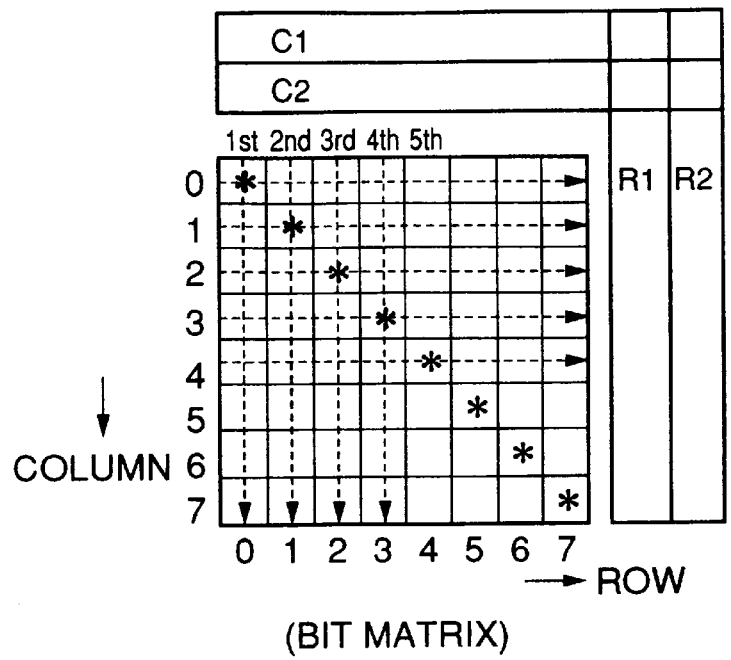
FIGS. 5($a$) and 5($b$) are illustrations for assistance in explaining a first practical example of the remedy decision processing executed by the method according to the present invention, in which the number of the bit mask processings exceeds the number of the remediable bit mask processings.

FIGS. 5(a) and 5(b) show a first example of the remedy decision processing according to the present invention, in which the number of the bit mask processings exceeds the number of the remediable bit mask processings in the main cells.

When the remedy decision flowchart as shown in FIG. 4 starts, fail data (bit fail data) are transferred from the tester to the redundancy processor (in Step S101). FIG. 5(a) shows a bit matrix obtained by transferring only the fail data from the buffer memory to the redundancy processor and further by developing the transferred fail data from the buffer memory 108 of the tester to the arithmetic processing unit 110 of the redundancy processor. Here, the fail data are transferred from the address (0, 0) to the address (7, 7) in sequence, where x denotes an x-th row and y denotes a y-th column.

Further, the redundancy processor decides whether the number of the fail addresses stored in the buffer memory 108 exceeds the maximum number of the fail bits (in Step S103). Here, since the numbers of the spare row and the spare column are two, respectively and further since the numbers of bits are eight in the spare row and spare column, respectively, the maximum number of the remediable fail bits is (8×2)+(8×2)=32. In the case of the bit matrix shown in FIG. 5(a), since the actual number of the fails is "8" and thereby since the maximum number of the fail bits is less than 32, the remedy is not decided as being impossible at this time point.

Successively, the line fail detection and the remedy processing are executed (in Step S105). In this case, the redundancy processor decides whether the number of the line fails exceeds the number of the spare row or the number of the spare column (in Step S107). In FIG. 5(a), since all the fail data are of one bit fail data and further since the number of the fail data is less than the number of the row spares of "2" and the number of the column spares of "2", there exists no line fail, so that the remedy is not decided as being impossible at this time point.

Further, the bit mask processing is executed (in Step S109). As already explained, the bit mask processing is executed for each fail address in sequence. In this case, when the bit mask processing is executed from the bit fail (0, 0) to the bit fail (4, 4), the number of the bit mask processings is "5".

Further, after the bit mask processings have been executed, the remedy decision is executed (in Step S111). Here, as already explained, since the maximum number of the remediable bit mask processings can be calculated by "R+C", in this example, R=2, and C=2, so that "R+C"=4.

This value of 4 is used as the limit value. As shown in FIG. 5(b), at the time point when the bit mask processing is executed for the bit fails (4, 4), since the number of the bit mask processings is "5" and thereby exceeds the limit value "4", the bit fail remedy is decided as being impossible (in Step S121), so that the bit fail remedy processing is no more executed.

On the other hand, when the number of the bit mask processings is less than the number of the remediable mask processings, the bit fail remedy processing is executed (in Step S115). Further, when the remedy is completed (in Step S117), the remedy is decided as being possible (in Step S119).

(2nd example)

Figures 6A, 6B:
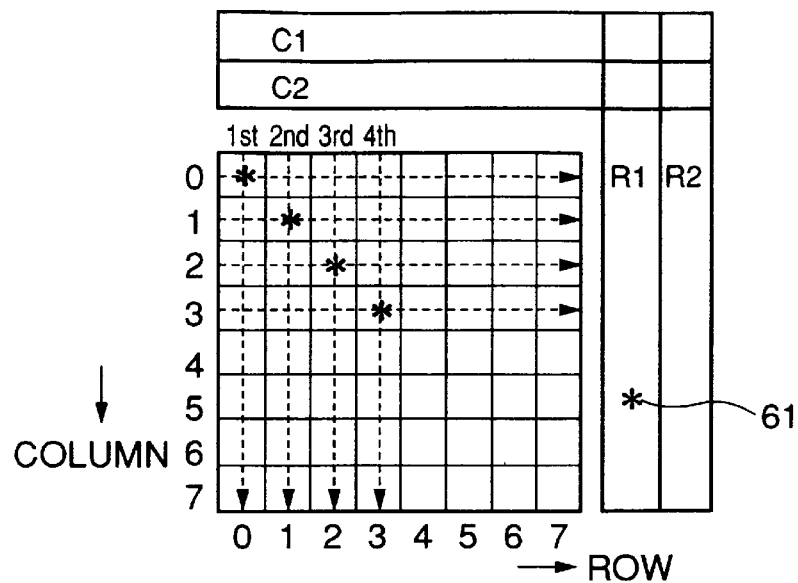
FIGS. 6($a$) and 6($b$) are illustrations for assistance in explaining a second practical example of the remedy decision processing executed by the method according to the present invention, in which the number of the bit mask processings is the same as the number of the remediable bit mask processings but one bit fail exists on the row spare cells.

FIGS. 6(a) and 6(b) show a second practical example of the remedy decision processing according to the present invention. In this example, the number of the bit mask processings for the main cell is the same as the number of the remediable bit mask processings, but there exists one bit fail on the spare cell.

Here, the memory the same as with the case of the first example as shown in FIG. 5(a) is assumed as shown in FIG. 6(a). In this second example, however, the fail data stored in the buffer memory of the tester are different from those of the first example; that is, there exists a fail bit 61 in the row spare.

In the flowchart shown in FIG. 4, the processing from the address (0, 0) to the address (3, 3) is the same as that of the first example. Here, since the number of the remediable mask processings is calculated as "4", there exists a possibility of remedy. In this example, however, since there exists a fail bit 61 on the row spare (in the 5th column of the row spare), there exists the case where the fail bit of the spare can be remedied. In this case, however, it is necessary to use another spare. For instance, when the fail bit on the row spare is remedied, this fail bit must be remedied by use of the column spare; on the other hand, the fail bit on the column spare must be remedied conversely by use of the row spare.

Here, in the case of the second example as shown in FIG. 6(b), since

Number of bit masks=number of the remediable bit mask processings in Step S111 of the flowchart shown in FIG. 4, the redundancy processor further decides whether there exists or remains a fail bit on the row spare or the column spare in Step S113. In the case where the fail bit exists or remains, the remedy is decided as being impossible (in Step S121).

In the prior art test system, in the same way as with the case of the first example, the bit fail remedy processing is first executed for the main cell, and then the remedy is decided as being impossible only after the fail bit remedy processing for the spare has been executed. According to the present invention, however, the remedy can be decided as being impossible without executing these processings.

(3rd example)

Figures 7A, 7B:
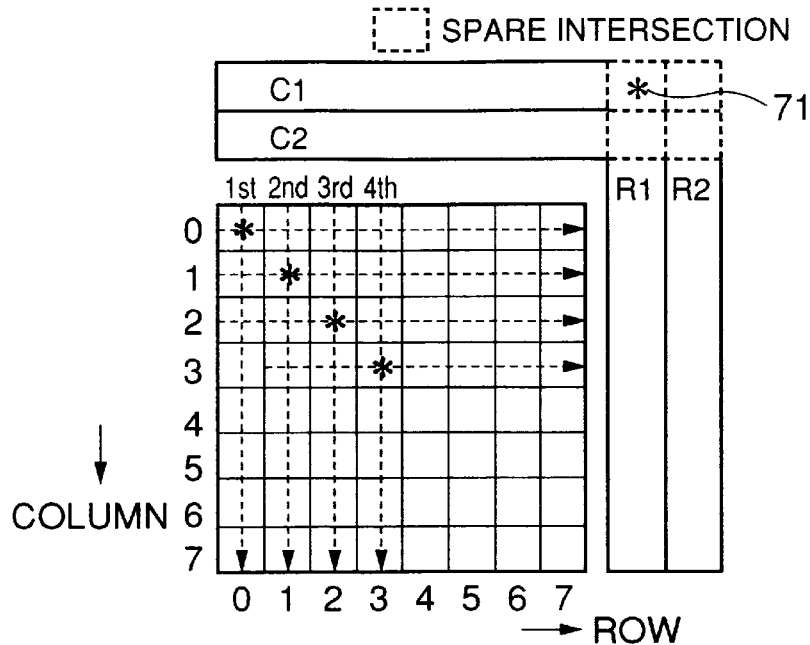
FIGS. 7($a$) and 7($b$) are illustrations for assistance in explaining a third practical example of the remedy decision processing executed by the method according to the present invention, in which the number of the bit mask processings is the same as the number of the remediable bit mask processings but one bit fail exists on an intersection between the spare row and the spare column.

FIGS. 7(a) and 7(b) show a third example of the remedy decision processing according to the present invention. In this example, the number of the bit mask processings of the main cell is the same as the number of the remediable bit mask processings, but there exists a bit fail at an intersection between the row spare and the column spare.

As shown in FIG. 7(a), the memory the same as with the case of the first example is assumed. In this third example, the fail data stored in the buffer memory of the tester are different from those of the first example; that is, a fail bit 71 exists at an intersection between the row spare and the column spare.

In the flowchart shown in FIG. 4, the processing from the address (0, 0) to the address (3, 3) is the same as that of the first example. Here, since the number of the remediable mask processings is calculated as "4", there exists a possibility of remedy. In this example, however, since there exists a fail bit 71 at an intersection between the row and column spares, it is impossible to use all the spares existing on the extension line of the fail bit 71 together for replacement. For instance, the spare row R1 and the spare column C1 are not used in FIG. 7(a).

Therefore, in the case of the third example as shown in FIG. 7(b), since

Number of bit masks=number of the remediable bit mask processings in Step S111 of the flowchart shown in FIG. 4, the redundancy processor further decides whether there exists or remains a fail bit at an intersection between the row spar and the column spare. In the case where the fail bit exists or remains at the intersection, the remedy is decided as being impossible (in Step S121).

In the prior art test system, although the remedy is decided as being impossible only after the processing has been executed under consideration of the fail bit at a spare intersection. According to the present invention, however, the remedy can be decided as being impossible without executing these processings.

Here, the fail bit remedy processing according to the present invention will be described hereinbelow with reference to FIGS. 8(a) and 8(b).

Figures 8A, 8B:
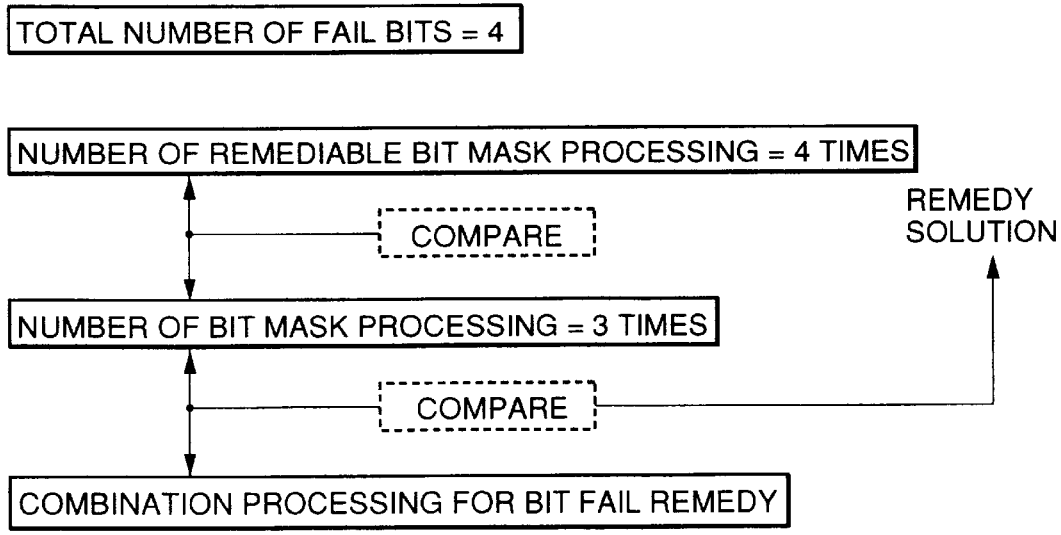
FIGS. 8($a$) and 8($b$) are illustrations for assistance in explaining a fourth practical example of the bit fail remedy processing executed by the method according to the present invention, in which the number of the bit mask processings is less than the number of the remediable bit mask processings so that the bit fail remedy decision processing can be executed.

In FIG. 8(a), a memory the same as with the case of the above-mentioned examples is assumed. In this case, the data stored in the buffer memory of the tester are different from the above-mentioned examples; that is, there exists four fail bits, as shown in FIG. 8(a).

Here, in the same way as with the case of the above-mentioned examples, the bit mask processing is executed. After the line fail detection and the remedy processing have been completed (in Step S105), when the bit mask processing is executed for each fail at the addresses (0, 0), (1, 1) and (2, 2) as shown in FIG. 8(a) (in Step S109), it is possible to remedy the fail at the address (2, 3). Therefore, as shown in FIG. 8(b), since the number of the bit mask processings is "3"; on the other hand, since the number of the remediable bit mask processings is calculated as "4", here the remedy is decided as being possible (in Step S111), so that the succeeding bit fail remedy processing is executed (in Step S115).

In general, in the case of the bit fail remedy, all the combinations of the replacement of the fail bits with the remaining spares are executed, and the combination in which the number of the used spares is the minimum is obtained as the remedy solution.

Here, FIG. 9 is an illustration for assistance in explaining the replacement combinations for bit fail remedy executed by the prior art test system.

As shown in FIG. 9, in the case of the prior art test system, the replacement combinations with the row spares and the column spares are executed in sequence in the bit fail remedy processing (in Step S115). In more detail, when the four bit fails are remedied, for instance, the first replacement combination is as follows: the first bit fail is remedied by use of the spare row R1, the second bit fail is remedied by use of the spare row R2, and the remaining bit fails are remedied by use of the spare columns C1 and C2 in sequence. Here, there exist 24 replacement combinations as described above, as permutation. Therefore, in the prior art test system, the remedy can be decided as being impossible only after all the replacement combinations of 24 sorts have been all processed. Further, in the case where the remedy is decided as being possible, an appropriate replacement combination is selected only after all the combinations have been processed.

In the present invention, however, it is possible to decide the remedy as being possible without executing the 24 sorts of replacement combinations.

Further, as shown in FIG. 8(b), after the remedy has been decided as being possible, it is possible to execute the bit fail remedy combination processing in a short time by use of the number of the bit mask processings, as explained hereinbelow.

FIG. 10 is an illustration for assistance in explaining the replacement combinations of bit fail remedy processing according to the present invention.

In this example, as shown in FIG. 8(b) and FIG. 10, the number of bit mask processings of "3" is used sa the stop (i.e., limit) value of the replacement combinations. Further, the replacement combinations are executed in sequence, and the number of the bit mask processings is compared with "3" for each replacement combination processing. Here, when the number of the spares used in a combination becomes the same as the number of the bit mask processings in a replacement combination (i.e., "R1–C1–R2" in FIG. 10), this replacement combination is decided and outputted as a remedy solution having the minimum number of used spares, so that the replacement combination processing can be completed at this stage. In other words, according to the present invention, it is possible to obtain a remedy solution without executing all the replacement combinations.

Further, the present invention is not limited only to the above-mentioned examples in the memory size and the spare size. In addition, the processing programs as described above can be recorded in an appropriate recording medium.

The effects of the semiconductor test system according to the present invention will be summarized as follows:

(1st effect)

When the wafer is tested and further the remedy is decided as being possible or impossible by use of the redundancy processor according to the present invention, it is possible to shorten the time required for the remedy decision processing, in comparison with that required for the prior art test system.

In more detail, in the case of the prior art bit fail remedy decision processing, some usable spares are allocated to the fail addresses. In this case, since the replacement combinations are executed for all the combinations of the spare rows and the spare columns, the number of the combinations increases with increasing numbers of the bit fails and the spares, with the result that a long remedy processing time is inevitably needed. Therefore, there exists a problem in that when a defective device (having many bit fails so that decided as being defective eventually) is tested, the remedy decision can be obtained only after all the replacement combinations have been executed.

On the other hand, in the test system according to the present invention, before the bit fail remedy is decided, the bit mask processing is executed for each fail address. Further, the number (an addition of the spare rows and the column rows) of the remediable bit mask processings is used as a limit value, and this limit value is compared with the number of the calculated bit mask processings for remedy decision. Therefore, since the wasteful bit fail remedy processing is not executed for the detective device, it is possible to shorten the remedy decision time to that extent.

For instance, the assumption is made that the time required to decide the bit fail remedy of the defective device to be measured is 10 sec and further that the occurrence ratio of fails detectable by the test system according to the present invention is 15%. Further, when the number of the measurement indices is 4, when the number of chips formed on a single wafer is 200, when the number of the chips measured simultaneously is 64, and when the number of the devices processed by the redundancy processor at the same time is 8, the processing time T shortened for each wafer can be expressed as $$T = \text{(number of measurement indices)} \times$$
$$\text{(detectable fail occurrence ratio)} \times$$
$$\text{(bit fail remedy decision time)} \times$$
$$\text{(number of simultaneous measurements/number of measured}$$
$$\text{devices processed by redundancy processor simultaneously)}$$
$$= 4 \times 0.15 \times 10 \times (64/8) = 48 \text{ sec per wafer}$$

Therefore, if one lot is composed of 25 wafers, it is possible to shorten the processing time by 48 seconds×25 wafers=20 minutes.

Further, when the test time is assumed as 250 seconds; the number of chips of one wafer is assumed as 200; the number of one lot is assumed as 25 wafers; and the number of simultaneous measurements by the test system is assumed as 64 wafers, the number of lots measured by use of a single test system can be expressed as follows: Here, in general, the number of the required test systems is the number of the test systems required to produce the devices. For instance, (30 days×24 hours)×(test system availability factor: 0.8)=576 hours is assumed as the operating time of a single test system.

In the case of the prior art test system,

Number of lots=(availability factor of one test system)/(test time)×number of indices of one wafer)×(number of wafers of one lot)=about 83 lots.

On the other hand, in the case of the test system according to the present invention, since the processing time of about 20 minutes per lot can be shortened, when 83 lots are measured, about 28 hours (83 lots×20 minutes) can be shortened.

When this time is converted into the number of the required test systems, (28 hours)/(operating time of one test system=576 hours)=about 0.05 test systems Therefore, when the price of one memory test system is assumed as being two hundred million yens (\200,000,000), the cost of about ten million yens (\10,000,000) can be economized.

(2nd effect)

In general, when the bit fail remedy is executed and further the remedy solution is obtained, it is necessary to obtain a solution which requires the minimum number of the used spares from among some remedy solutions. In the prior art test system, since the combinations of all the spares must be executed, the number of the combinations increases with increasing number of the usable spared, with the result that a long remedy processing time is needed.

On the other hand, in the test system according to the present invention, before the bit fail remedy is decided, the bit mask processing is executed for each fail address. Further, the number of the bit mask processings is calculated, and the number of the calculated bit mask processings is compared with the number of the remediable bit mask processings (used as a limit value) for remedy decision. Further, when the number of the remedy solutions is the same as the number of the bit mask processings, the combination processing is completed, and a solution having the minimum number of used spares is decided and outputted as the remedy solution. As a result, it is possible to shorten the remedy decision processing time by the time required for all the replacement combinations, without executing the wasteful bit fail remedy processing for the defective device to be measured.

Here, for instance, the assumption is made that the time required to decide the bit fail remedy possibility is 10 seconds and further that the detection ratio of the measured devices found out in a half (5 seconds) of the time required for the total combinations is 10% per wafer. Further, when the number of chips formed on a single wafer is 200; the number of the chips measured simultaneously is 64; and the number of the devices processed by the redundancy processor at the same time is 8, the processing time T' shortened for each wafer can be expressed as $$T' = \text{(number of measurement indices)} \times$$
$$\text{(device detection ratio due to reduced combinations} \times$$
$$\text{(reduced time)} \times \text{(number of simultaneous measurements/}$$
$$\text{number of measured devices processed simultaneously)}$$
$$= 4 \times 0.1 \times 5 \times (64/8) = 16 \text{ sec per wafer}$$

Therefore, if one lot is composed of 25 wafers, it is possible to shorten the processing time by 16 seconds×25 wafers=7 minutes.

Further, since the number of lots measured by a single test system is 83 lots, when the same number of lots is measured, it is possible to shorten the processing time by 83 lots×7 minutes=about 9.7 hours.

When this time is converted into the number of the required test systems, (9.7 hours)/(operating time of one test system=576 hours)=about 0.017 test systems.

Therefore, when the price of one memory test system is assumed as being two hundred million yens (\200,000,000), the cost of about three million yens (\3,400,000) can be economized.

Further, the additional feature of the semiconductor test system according to the present invention will be described hereinbelow with reference to the attached drawings. Here, the additional feature is that the test system can minimize the number of the fail addresses to be stored in the redundancy processor, and thereby to reduce the capacity of the buffer memory thereof.

Figures 11A, 11B:
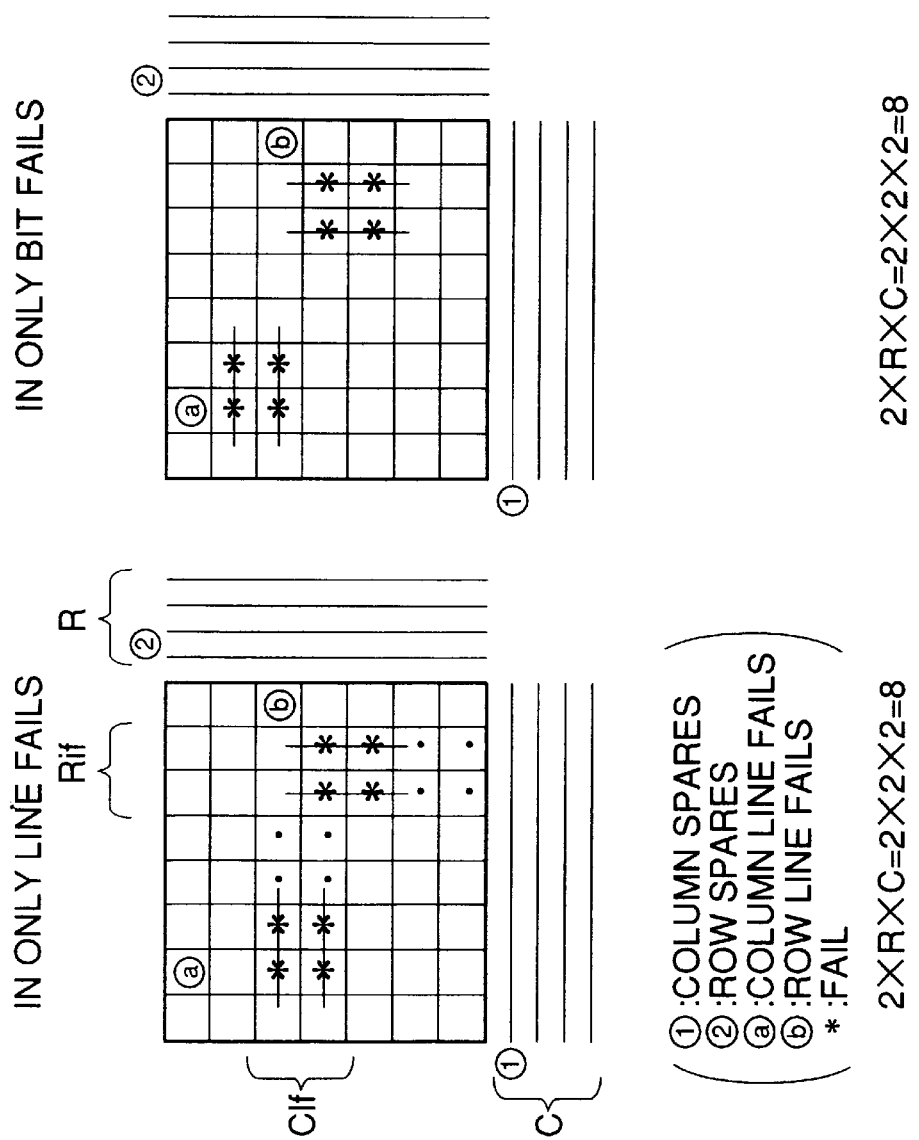
FIG. 11($a$) is an illustration for assistance in explaining the maximum number of data storable in the buffer memory of the redundancy processor, in which only the line fails exist.

FIGS. 11(a) and 11(b) are illustrations for assistance in explaining the maximum number of fail addresses stored in the buffer memory of the redundancy processor according to the present invention. in which FIG. 11(a) shows the case where only the line fails exist and FIG. 11(b) shows the case where only the bit fails exist.

Here, the maximum storable number $A_{max}$ of the fail addresses stored in the buffer memory 108 can be expressed, irrespective of the line fails and the bit fails, as follows:

$$A_{max} = \text{number of fail addresses stored due to row line fails} +$$
$$\text{number of fail addresses stored due to column line fails} +$$
$$\text{number of fail addresses remediable by remaining spares}$$

-continued $$= R_{1f} \times C + C_{1f} \times R + C \times (R - R_{1f}) + R \times (C - C_{1f}) R_{1f} \times C +$$
$$C_{1f} \times R + C \times R - C \times R_{1f} + R \times C - R \times C_{1f}$$
$$= 2 \times R \times C$$

where R denotes the number of the row spares; C denotes the number of the column spares; $R_{lf}$ denotes the number of the row line fails; and $C_{lf}$ denotes the number of the column line fails.

On the other hand, when the above-mentioned processing is executed, the maximum remediable number $S_{max}$ of the fail addresses can be expresses as $$S_{\max} = \text{(number of row spares)} \times \text{(number of column spares)} +$$
$$\text{(number of column spares)} \times \text{(number of row spares)}$$
$$= (R \times C) + (C \times R) = 2 \times R \times C$$

Therefore, it can be understood that the maximum number $A_{max}$ of the fail addresses storable in the buffer memory 108 is equal to the maximum remediable number $S_{max}$ of the fail addresses.

Therefore, it is possible to decide the impossibility of the remedy on the basis of this value $S_{max}$. In this case, the maximum storable number $A_{max}$ is previously set as a limit value, and the remedy impossibility can be decided when the number of the fail addresses stored in the buffer memory exceeds this limit value $A_{max}$. Since the remedy decision can be executed at a high speed on the basis of this processing, it is possible to shorten the remedy decision time markedly.

The above-mentioned feature will be described in further detail on the basis of some practical examples.

Figures 12A, 12B:
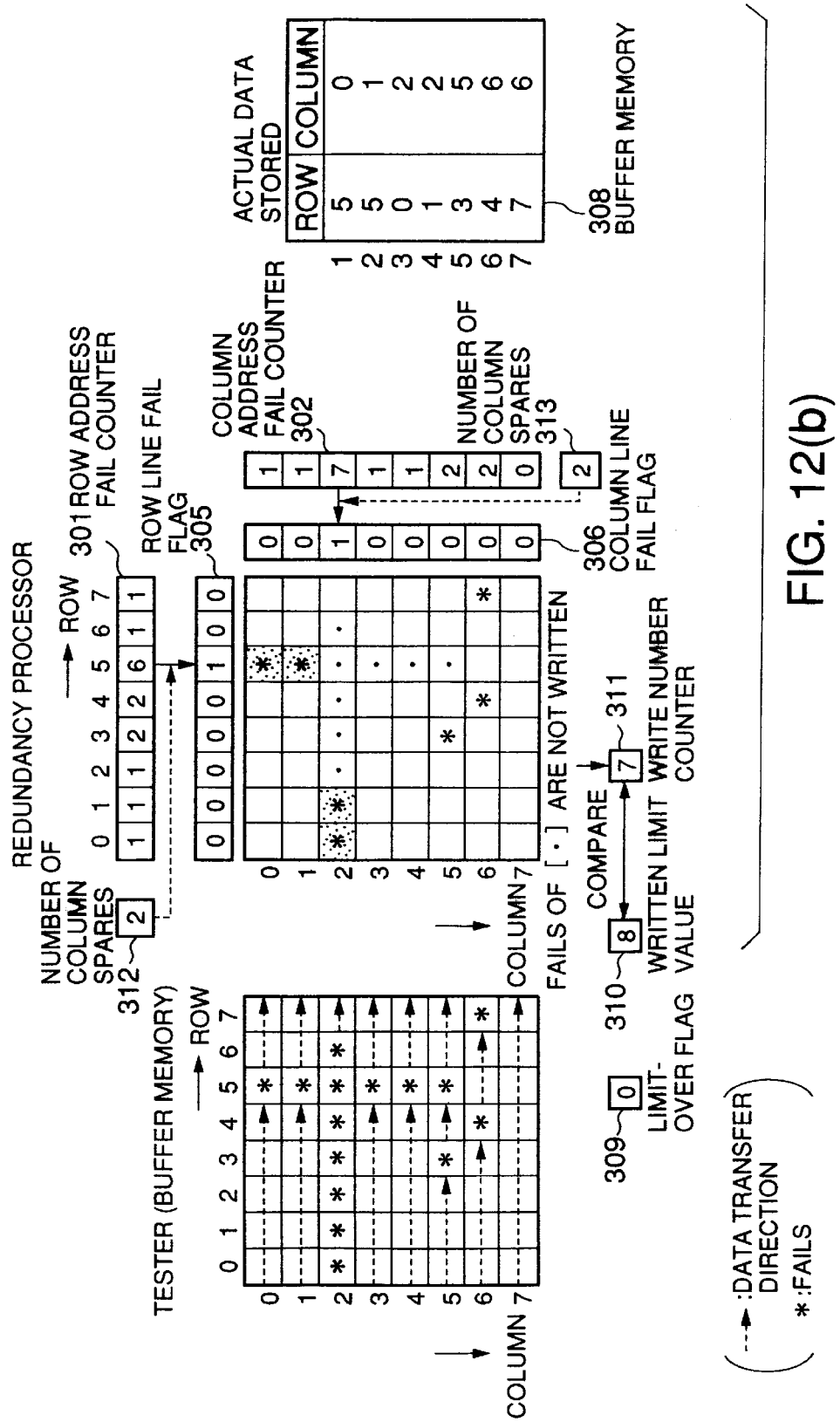
FIG. 12($a$) is an illustration for assistance in explaining the operation of the buffer memory of the tester, in which the number of data stored in the buffer memory thereof does not exceed the upper limit thereof.

FIGS. 12(a) and 12(b) are illustration for assistance in explaining the operation of the test system according to the present invention, in which the number of the fail addresses does not exceed the maximum storable number $A_{max}$. Further, FIG. 12(a) shows the buffer memory of the tester and FIG. 12(b) shows the buffer memory of the redundancy processor.

Here, the assumption is made that the memory has 64 addresses in total of 8 row addresses and 8 column addresses. Further, the fail data as shown in FIG. 12(a) are assumed to be stored in the buffer memory of the test system. Further, if the number of spares is two in both row and column, respectively, the redundancy processor sets the number of the row spares R to "2" and the number of the column spares C to also "2", so that the number of write limit of 2×2×2="8" is automatically set thereto (because the maximum storable number $A_{max}$ of the buffer memory is 2×R×C as already explained). On the basis of the above-mentioned setting, the fail data are transferred from the test-side buffer to the redundancy processor.

Here, as shown in FIG. 12(b), the fail data are transferred beginning from address (0, 0) to address (7,7) in sequence, where (x, y) denotes an address of x-row and an address of y-column. In this case, first the fail data of 0-th column are transferred in sequence. In this case, although the column address fail counter 302 does not count the fail addresses from (0, 0) to (4, 0), when the fail data at (5, 0) is transferred, since this data is fail data, a row line address fail counter 301 and a column line address fail counter 302 corresponding thereto both count "1", so that the address is stored in the buffer memory 308. After that, although the similar counting processing and the similar address storing are executed in sequence in the same way as above, since the value of the column address fail counter 302 at the column address "2" exceeds the number of the row spares beginning from the fail address (2, 2), the column line fail of the column address "2" is decided, so that the column line fail flag 306 is set to "1" and, after that, the fail address at the column address "2" is no more written in the buffer memory 308.

Successively, beginning from the fail address (5, 2), since the value of the row address fail counter 301 at the row address "5" exceeds the number of column spares, the row line fail at the row address "5" is decided, so that the row line fail flag 305 is set to "1" and, after that, the fail address of the row address "5" is not written in the buffer memory 308.

Further, the number of fail addresses written in the buffer memory 308 is counted by a write number counter 311. In this example, since the final number of written addresses is "7" without exceeding the write limit number of "8", the remedy is not decided as being impossible at this time point.

Further, since only the fail addresses are written in the buffer memory 308, 7 fail addresses are stored as shown by FIG. 12(b). In comparison with this, in the prior art test system, since 14 fail address must be stored, it is possible to reduce the memory capacity roughly half of that of the prior art buffer memory.

As described above, in the present invention, it is not necessary to store all the line fail addresses in the buffer memory, and the necessary capacity of the buffer memory can be decided on the basis of the number of the spares as expressed by the afore-mentioned expression, without depending upon the row address size and the column address size of the device, with the result that it is possible to reduce the necessary capacity of the buffer memory markedly.

Figures 13A, 13B:
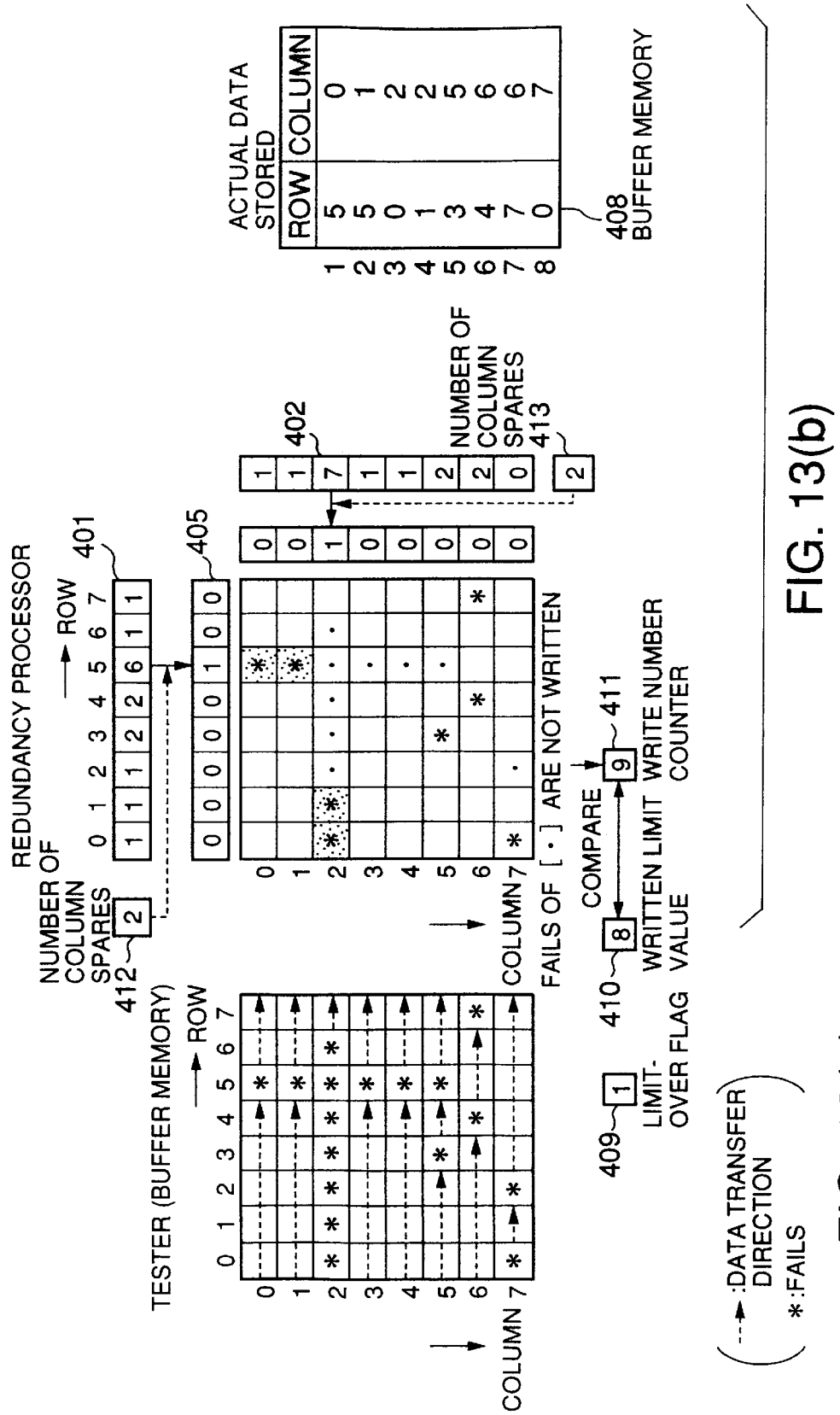
FIG. 13($a$) is an illustration for assistance in explaining the operation of the buffer memory of the tester, in which the number of data stored in the buffer memory thereof exceeds the upper limit thereof.

FIGS. 13(a) and 13(b) are illustration for assistance in explaining the operation of the test system according to the present invention, in which the number of the fail addresses exceeds the maximum storable number $A_{max}$. Further, FIG. 13(a) shows the buffer memory of the tester and FIG. 13(b) shows the buffer memory of the redundancy processor.

In FIGS. 13(a) and 13(b), a memory the same as with the case shown in FIGS. 12(a) and 12(b) is assumed. In this example, the fail data stored in the buffer memory of the tester are different from those shown in FIGS. 12(a) and 12(b). The processing from address (0, 0) to address (7, 6) is the same as with the case shown in FIGS. 12(a) and 12(b); that is, the fail addresses are stored in the buffer memory 408 in sequence on the basis of the fail data transferred from the tester.

Successively, although an address (0, 7) is stored in the buffer memory 408 due to fail, when the succeeding fail data at an address (3, 7) is transferred, since the value of the write number counter exceeds the write limit value of "8" at this address (3, 7), this address is not written in the buffer memory 408. Further, the remedy is decided as being impossible at this time point, and "1" is set to a limit-over flag 409. Therefore, it is possible to immediately know the decision of impossible remedy with reference to this limit-over flag 409.

In the prior art test system, this decision of impossible remedy is executed by the remedy decision processing executed after all the fail data have been transferred to the buffer memory of the redundancy processor. In the present invention, however, since the impossible remedy can be decided when the fail data are being transferred, it is possible to shorten the time required for the decision of impossible remedy, in comparison with the prior art test system.

(3rd effect)

Therefore, when the wafer is tested by use of the redundancy processor according to the present invention, it is possible to reduce the capacity of the buffer memory for storing the fail addresses, in comparison with the prior art system.

In more detail, in the case of the recent large capacity memory device, the number of the spares tends to be increased in general. Here, for instance, the assumption is made that the memory has an address space 64M (=16K×4K and the number of spares is 512 in row and 256 in column. Further, the number of the fail addresses replaceable with a single spare is assumed to be 4K in spare row and 16K in spare column (although being different depending upon the remedy circuit construction and the test method).

In this case, in the prior art system, it is necessary to store the addresses of 64M (=4K×512)+(16K×256). On the other hand, in the test system according to the present invention, only the address of 256 (=2×512×256) are stored. Therefore, it is possible to reduce the necessary capacity of the buffer memory down to about $\frac{1}{24}$ of that of the prior art test system on the basis of a simple calculation.

Therefore, when a single address is assumed to be stored by use of 32 bits and further the capacity of the memory devices for constituting the buffer memory is assumed to be 1M bits, although 192 memory devices are necessary in the case of the prior art test system, the test system according to the present invention can be constructed by use of only 8 memory devices. For instance, when the price of a single memory device is assumed to be \1,500, the cost of the memory devices can be reduced by about \276,000. Therefore, if the number of the devices measured at the same time is assumed to be 64, it is possible to economize the cost of about \17,664,000 (=276,000×64). Further, it is possible to further reduce the measurement cost of the memory devices under considerations of the other effects such as the smaller number of substrates due to the smaller number of the memory devices, the small-sized test system casing, etc.

(4th effect)

Further, when the remedy decision processing is executed by use of the maximum storable number $A_{max}$ of the buffer memory, it is possible to execute the remedy decision processing in a short time, as compared with that of the prior art test system. That is, in the prior art test system, the remedy decision of bit fails is executed by allocating the usable spares to the fail addresses. In this case, all the replacement combinations of the row spares and the column spares are checked. Therefore, the number of the replacement combinations increases with increasing number of spares, with the result that the processing time is lengthened. In contrast with this, in the case of the test system according to the present invention, since the remedy is decoded as being impossible while the fail data are being transferred, it is possible to shorten the test time to that extent.

For instance, when the remedy decision time of the bit fails is assumed to be 5 seconds and further the occurrence ratio of detectable fails of the present invention is assumed to be 10% per wafer, in the case where the number of chips of one wafer is 100, it is possible to shorten the processing time by 10×5=50 seconds. Further, in the case where the one lot is composed of 25 wafers, it is possible to shorten the processing time by about 50×25=20 minutes.

What is claimed is:

1. A method of testing a semiconductor device, comprising:

a step of executing bit matrix processing for erasing addresses each having fail data in both row and column direction lines on the basis of fail data and fail data addresses; and a step of executing remedy possibility decision for comparing the number of bit matrix processing times executed in the above bit matrix processing step with the number of remediable processing times obtained by adding the number of row spares and the number of column spares, and for deciding that fail remedy is impossible only when the number of the bit matrix processing times exceeds the number of the remediable processing times.

2. The method of testing a semiconductor device of claim 1, wherein when the number of bit matrix processing times is equal to the number of the remediable processing times, the fail remedy is decided to be impossible only when a fail exists on the spare row or the spare column.

3. The method of testing a semiconductor device of claim 1, wherein when the number of bit matrix processing times is equal to the number of the remediable processing times, the fail remedy is decided to be impossible only when a fail exists at an intersection of both the spare row and the spare column.

4. The method of testing a semiconductor device of claim 1, wherein when the fail remedy is decided to be possible in the remedy possibility decision processing step, the semiconductor device testing method further comprises a step of executing replacement processing of all the fails with the spares on the basis of sequential combinations of predetermined spare rows and predetermined spare columns, when the number of spares required for the fail replacement processing is equal to the number of the bit matrix processing times, the replacement processing being stopped to execute the fail remedy on the basis of the fail spare combinations obtained at that moment.

5. A method of testing a semiconductor device, comprising:

a step of executing line fail remedy processing for detecting and remedying line fails on the basis of fail data and fail data addresses both obtained by a semiconductor device having a redundancy circuit and transferred from a tester;

a step of executing bit matrix processing for erasing fails at the respective fail addresses each having a bit fail and not yet remedied in the above line fail remedy processing step, from among the fail addresses each having the fail data, in both row and column direction lines, respectively; and a step of executing remedy possibility decision processing for comparing the number of bit matrix processing times executed in the above bit matrix processing step with the number of remediable processing times obtained by adding the number of row spares and the number of column spares both still remaining after having been used in the above line fail remedy processing step, and for deciding that fail remedy is impossible only when the number of the bit matrix processing times exceeds the number of the remediable processing times.

6. The method of testing a semiconductor device of claim 5, wherein when the number of bit matrix processing times is equal to the number of the remediable processing times, the fail remedy is decided to be impossible only when a fail exists on the spare row or the spare column.

7. The method of testing a semiconductor device of claim 5, wherein when the number of bit matrix processing times is equal to the number of the remediable processing times, the fail remedy is decided to be impossible only when a fail exists at an intersection of both the spare row and the spare column.

8. The method of testing a semiconductor device of claim 5, wherein when the fail remedy is decided to be possible in the remedy possibility decision processing step, the semiconductor device testing method further comprises a step of executing replacement processing of all the fails with the spares on the basis of sequential combinations of predetermined spare rows and predetermined spare columns, when the number of spares required for the fail replacement processing is equal to the number of the bit matrix processing times, the replacement processing being stopped to execute the fail remedy on the basis of the fail spare combinations obtained at that moment.

9. A semiconductor test system, which comprises:
first storing means for storing fail addresses each having fail data on the basis fail data and fail data addresses;
second storing means for storing an addition value of both the number of row spares and the number of column spares, as the number of remediable processing times;
bit matrix processing means for causing a computer to erase fails in both row and column direction lines at the respective fail addresses stored in said first storing means;
third storing means for storing the number of bit matrix processing times executed by said bit matrix processing means; and
remedy possibility deciding means for causing a computer to compare the number of bit matrix processing times stored in said third storing means with the number of remediable processing times stored in said second storing means, to decide that fail remedy is impossible only when the number of the bit matrix processing times exceeds the number of the remediable processing times.

10. The semiconductor test system of claim 9, which further comprises remedy processing means, when said remedy possibility deciding means decides that remedy is possible, for causing a computer to execute replacement processing of all the fails with the spares on the basis of sequential combinations of predetermined spare rows and predetermined spare columns, when the number of spares required for the fail replacement processing is equal to the number of the bit matrix processing times, the replacement processing being stopped to execute the fail remedy on the basis of the fail spare combinations obtained at that time.

11. The semiconductor test system of claim 10, which further comprises fail data storing means for storing fail data of a semiconductor device having a redundancy circuit, to transfer the fail data and the fail addresses.

12. A semiconductor test system, which comprises:
first storing means for storing fail addresses each having fail data on the basis fail data and fail data addresses both obtained by a semiconductor device having a redundancy circuit and transferred from a tester;
line fail remedy processing means for causing a computer to detect line fails on the basis of the fail data and the fail addresses;
second storing means for storing an addition value of both the number of row spares and the number of column spares both still remaining after used by said line fail remedy processing means, as the number of remediable processing times;
bit matrix processing means for causing a computer to erase fails at the respective fail addresses each having a bit fail not yet remedied by said line fail remedy processing means, from among the fail addresses each having the fail data, in both row and column direction lines;
third storing means for storing the number of bit matrix processing times executed by said bit matrix processing means; and
remedy possibility deciding means for causing a computer to compare the number of bit matrix processing times stored in said third storing means with the number of remediable processing times stored in said second storing means, to decide that fail remedy is impossible only when the number of the bit matrix processing times exceeds the number of the remediable processing times.

13. The semiconductor test system of claim 12, which further comprises remedy processing means, when said remedy possibility deciding means decides that remedy is possible, for causing a computer to execute replacement processing of all the fails with the spares on the basis of sequential combinations of predetermined spare rows and predetermined spare columns, when the number of spares required for the fail replacement processing is equal to the number of the bit matrix processing times, the replacement processing being stopped to execute the fail remedy on the basis of the fail spare combinations obtained at that time.

14. The semiconductor test system of claim 12, which further comprises fail data storing means for storing fail data of a semiconductor device having a redundancy circuit, to transfer the fail data and the fail addresses.

15. A memory medium for recording a semiconductor test program, which comprises:
bit matrix processing means for causing a computer to erase addresses each having fail data in both row and column direction lines on the basis of fail data and fail data addresses; and
remedy possibility deciding means for causing a computer to compare the number of bit matrix processing times executed by said bit matrix processing means with the number of remediable processing times obtained by adding the number of row spares and the number of column spares and to decide that fail remedy is impossible only when the number of the bit matrix processing times exceeds the number of the remediable processing times.

16. The memory medium for recording a semiconductor test program of claim 15, wherein when the fail remedy is decided to be possible by the remedy possibility decision processing means, the test program further comprises remedy processing means for causing a computer to execute replacement processing of all the fails with the spares on the basis of sequential combinations of predetermined spare rows and predetermined spare columns, when the number of spares required for the fail replacement processing is equal to the number of the bit matrix processing times, the replacement processing being stopped to execute the fail remedy on the basis of the fail spare combinations obtained at that moment.

17. A memory medium for recording a semiconductor test program, which comprises:
line fail remedy processing means for causing a computer to detect and remedy line fails fail on the basis of fail data and fail data addresses both obtained by a semiconductor device having a redundancy circuit and transferred from a tester;
bit matrix processing means for causing a computer to erase fails at the respective fail addresses each having a bit fail and not yet remedied by said line fail remedy processing means, from among the fail addresses each having the fail data, in both row and column direction lines, respectively; and remedy possibility decision processing means for causing a computer to compare the number of bit matrix processing times executed by said bit matrix processing means with the number of remediable processing times obtained by adding the number of row spares and the number of column spares both still remaining after having been used by said line fail remedy processing means, and to decide that fail remedy is impossible only when the number of the bit matrix processing times exceeds the number of the remediable processing times.

18. The memory medium for recording a semiconductor test program of claim 17, wherein when the fail remedy is decided to be possible by the remedy possibility decision processing means, the test program further comprises remedy processing means for causing a computer to execute replacement processing of all the fails with the spares on the basis of sequential combinations of predetermined spare rows and predetermined spare columns, when the number of spares required for the fail replacement processing is equal to the number of the bit matrix processing times, the replacement processing being stopped to execute the fail remedy on the basis of the fail spare combinations obtained at that moment.

19. A semiconductor test system, which comprises:
counting means for causing a computer to count the number of fails at addresses on the basis of addresses and fail data at each address both transferred from a tester;
detecting means for causing a computer to decide a line fail on the basis of a value counted by said counting means;
storing means for storing fail addresses each having fail data; and
control means for causing a computer to write the fail addresses in said storing means in sequence on the basis of the addresses transferred by the tester and decision results of said detecting means.

20. The semiconductor test system of claim 19, wherein said detecting means comprises:
a row address fail counter for counting the number of fails at each row address on the basis of the row addresses and the fail data at the row addresses both transferred from the tester, to decide a row line fail when a value counted by said row address fail counter exceeds the number of column spares; and
a column address fail counter for counting the number of fails at each column address on the basis of the column addresses and the fail data at the column addresses both transferred from the tester, to decide a column line fail when a value counted by said column address fail counter exceeds the number of row spares.

21. The semiconductor test system of claim 19, which further comprises:
row line fail displaying means for causing a computer to display a column line fail at the corresponding row address whenever said detecting means decides a line fail; and
column line fail displaying means for causing a computer to display a row line fail at the corresponding column address whenever said detecting means decides a line fail.

22. The semiconductor test system of claim 19, wherein when said detecting means decides the line fail, said control means will not write the fail addresses in the corresponding row or column after that moment.

23. The semiconductor test system of claim 19, wherein when the number of the fails counted by said detecting means exceeds a maximum rated number of said storing means or a maximum number of the remediable fail addresses, said control means decides that remedy is impossible at that moment.

24. The semiconductor test system of claim 19, which further comprises limit-over displaying means for causing a computer to display a limit-over display indicative of that the number of the fail addresses exceeds the maximum rated number of said storing means or the maximum number of the remediable fail addresses.

25. The semiconductor test system of claim 23, wherein the maximum rated number of said storing means or the maximum number of the remediable fail addresses can be expressed by
2×(number of row spares)×(number of column spares).

26. A semiconductor test system, which comprises:
fail data storing means for storing fail data of a semiconductor device having a redundancy circuit;
detecting means for causing a computer to count the number of fails at each row address and the number of fails at each column address, respectively on the basis of fail address data indicative of defective addresses of the semiconductor device and transferred from said fail data storing means;
storing means for storing the fail addresses; and
control means for causing a computer to control data writing processing in such a way that when the value counted by said detecting means is less than a predetermined value, the fail addresses are stored in said storing means in sequence; on the other hand, when the value counted by said detecting means exceeds the predetermined value, the fail addresses are not stored in said storing means.

27. The semiconductor test system of claim 26, wherein said detecting means comprises:
a row address fail counter for counting the number of fails at each row address on the basis of the row addresses and the fail data at the row addresses both transferred from the tester, to decide a row line fail when a value counted by said row address fail counter exceeds the number of column spares; and
a column address fail counter for counting the number of fails at each column address on the basis of the column addresses and the fail data at the column addresses both transferred from the tester, to decide a column line fail when a value counted by said column address fail counter exceeds the number of row spares.

28. The semiconductor test system of claim 26, which further comprises:
row line fail displaying means for causing a computer to display a column line fail at the corresponding row address whenever said detecting means decides a line fail; and
column line fail displaying means for causing a computer to display a row line fail at the corresponding column address whenever said detecting means decides a line fail.

29. The semiconductor test system of claim 26, wherein when said detecting means decides the line fail, said control means will not write the fail addresses in the corresponding row or column after that moment.

30. The semiconductor test system of claim 26, wherein when the number of the fails counted by said detecting means exceeds a maximum rated number of said storing means or a maximum number of the remediable fail addresses, said control means decides that remedy is impossible at that moment.

31. The semiconductor test system of claim 26, which further comprises limit-over displaying means for causing a computer to display a limit-over display indicative of that the number of the fail addresses exceeds the maximum rated number of said storing means or the maximum number of the remediable fail addresses.

32. The semiconductor test system of claim 26, wherein the maximum rated number of said storing means or the maximum number of the remediable fail addresses can be expressed by 2×(number of row spares)×(number of column spares).

33. A method of testing a semiconductor device, which comprises:
   a step of counting the number of fails at addresses on the basis of addresses and fail data at each address both transferred from a tester;
   a step of deciding a line fail on the basis of the counted value;
   a step of storing fail addresses each having fail data; and
   a step of storing the fail addresses on the basis of the addresses transferred by the tester and decision results of the line fails.

34. The method of testing a semiconductor device of claim 33, wherein the step of deciding the line fail comprises:
   a step of counting the number of fails at each row address and the number of fails at each column address, respectively on the basis of the row addresses and the column addresses and the fail data at these addresses all transferred from a tester, to decide a row line fail or a column line fail when the counted value exceeds the number of column spares or the number of row spares, respectively.

35. The semiconductor test system of claim 33, wherein when the line fail is decided, the fail address in the corresponding row or column is not written after that moment.

36. The semiconductor test system of claim 33, wherein when the counted number exceeds a maximum rated number or a maximum number of the remediable fail addresses, the fail remedy is decided to be impossible at that moment.

37. The semiconductor test system of claim 36, wherein the maximum rated number or the maximum number of the remediable fail addresses can be expressed by 2×number of row spares)×(number of column spares).

38. The semiconductor test system of claim 33, wherein when the line fail is decided, the fail address in the corresponding row or column is not written after that moment.

39. A method of testing a semiconductor device, which comprises:
   a step of storing fail data of a semiconductor device having a redundancy circuit;
   a step of counting the number of fails at each row address and the number of fails at each column address, respectively on the basis of fail address data indicative of defective addresses of the semiconductor device and contained in the fail data; and
   a step of controlling data writing processing in such a way that when the counted value is less than a predetermined value, the fail addresses are stored; on the other hand, when the counted value exceeds the predetermined value, the fail addresses are not stored.

40. The method of testing a semiconductor device of claim 39, wherein the step of deciding the line fail comprises:
   a step of counting the number of fails at each row address and the number of fails at each column address, respectively on the basis of the row addresses and the column addresses and the fail data at these addresses all transferred from a tester, to decide a row line fail or a column line fail when the counted value exceeds the number of column spares or the number of row spares, respectively.

41. The semiconductor test system of claim 38, wherein when the counted number exceeds a maximum rated number or a maximum number of the remediable fail addresses, the fail remedy is decided to be impossible at that moment.

42. The semiconductor test system of claim 41, wherein the maximum rated number or the maximum number of the remediable fail addresses can be expressed by 2×(number of row spares)×(number of column spares).

43. A memory medium for recording a semiconductor test program, which comprises;
   counting means for causing a computer to count the number of fails at addresses on the basis of addresses and fail data at each address both transferred from a tester;
   deciding means for causing a computer to decide a line fail on the basis of the counted value;
   storing means for storing fail addresses each having fail data; and
   storing means for storing the fail addresses on the basis of the addresses transferred by the tester and decision results of the line fails.

44. A memory medium for recording a semiconductor test program, which comprises:
   storing means for storing fail data of a semiconductor device having a redundancy circuit;
   counting means for causing a computer to count the number of fails at each row address and the number of fails at each column address, respectively on the basis of fail address data indicative of defective addresses of the semiconductor device and contained in the fail data; and
   control means for causing a computer to control data writing processing in such a way that when the counted value is less than a predetermined value, the fail addresses are stored; on the other hand, when the counted value exceeds the predetermined value, the fail addresses are not stored.

* * * * *

UNITED STATES PATENT AND TRADEMARK OFFICE
CERTIFICATE OF CORRECTION

PATENT NO. : 5,983,374
DATED : November 9, 1999
INVENTOR(S) : Makoto TODOME, et al It is certified that error appears in the above-identified patent and that said Letters Patent is hereby corrected as shown below:

Please note on front cover of patent, insert item --[30] Foreign Application Priority Data, September 26, 1996 [JP] 8-254697; September 26, 1996 [JP] 8-254947--.

Signed and Sealed this

Seventeenth Day of April, 2001

Attest:

NICHOLAS P. GODICI

Attesting Officer    Acting Director of the United States Patent and Trademark Office